(12) United States Patent
Beaston et al.

(10) Patent No.: US 10,699,278 B2
(45) Date of Patent: Jun. 30, 2020

(54) BATTERY PACK MONITORING AND WARRANTY TRACKING SYSTEM

(71) Applicant: Powin Energy Corporation, Tualatin, OR (US)

(72) Inventors: Virgil Lee Beaston, Tualatin, OR (US); Daniel Dee Williams, Ridgefield, WA (US)

(73) Assignee: Powin Energy Corporation, Tualatin, OR (US)

( * ) Notice: Subject to any disclaimer, the term of this patent is extended or adjusted under 35 U.S.C. 154(b) by 662 days.

(21) Appl. No.: 15/389,188

(22) Filed: Dec. 22, 2016

(65) Prior Publication Data

US 2018/0181967 A1    Jun. 28, 2018

(51) Int. Cl.
| | | |
|---|---|---|
| *G06Q 30/00* | (2012.01) | |
| *G06Q 10/00* | (2012.01) | |
| *G01R 31/00* | (2006.01) | |
| *G06Q 10/06* | (2012.01) | |
| *G01R 31/382* | (2019.01) | |

(52) U.S. Cl.
CPC ..... *G06Q 30/012* (2013.01); *G06Q 10/06313* (2013.01); *G01R 31/382* (2019.01)

(58) Field of Classification Search
CPC .................. G06Q 10/00–50/00; G01R 31/382
USPC ............................................... 705/7.11–7.42
See application file for complete search history.

(56) References Cited

U.S. PATENT DOCUMENTS

| | | | |
|---|---|---|---|
| 5,825,155 | A | 10/1998 | Ito et al. |
| 5,952,815 | A | 9/1999 | Rouillard et al. |
| 6,060,864 | A | 5/2000 | Ito et al. |
| 6,172,481 | B1 | 1/2001 | Curtiss |

(Continued)

FOREIGN PATENT DOCUMENTS

| | | |
|---|---|---|
| CN | 1367565 A | 9/2002 |
| CN | 2648617 Y | 10/2004 |

(Continued)

OTHER PUBLICATIONS

International Search Report and Written Opinion on Patentability, dated Dec. 1, 2011, in International Patent Application No. PCT/CN2011/071548; 10 pages.

(Continued)

*Primary Examiner* — Mehmet Yesildag
*Assistant Examiner* — Mustafa Iqbal
(74) *Attorney, Agent, or Firm* — Sterne, Kessler, Goldstein & Fox P.L.L.C.

(57) ABSTRACT

Systems and methods are disclosed for monitoring battery usage information. In an embodiment, battery usage data is received from a battery energy storage system comprising a battery pack. The battery usage data may include battery identification information, one or more battery sensor measurements for a period of time, and a cumulative warranty value for the battery pack. A project to which the battery pack belongs may then be determined based on the received battery identification information. Finally, the battery usage data may be stored in a warranty database. The warranty database may store battery usage data for a plurality of battery packs. The warranty database may further be partitioned by project, and the battery usage data for is stored in a partition of the warranty database for the determined project.

20 Claims, 31 Drawing Sheets

(56) References Cited

U.S. PATENT DOCUMENTS

| | | |
|---|---|---|
| 7,497,285 B1 | 3/2009 | Radev |
| 7,583,053 B2 | 9/2009 | Kamohara |
| 8,111,035 B2 | 2/2012 | Rosenstock |
| 9,168,836 B2 | 10/2015 | Jacobsen |
| 9,331,497 B2 | 5/2016 | Beaston |
| 9,647,463 B2 | 5/2017 | Brandl et al. |
| 9,847,654 B2 | 12/2017 | Beaston |
| 9,996,397 B1* | 6/2018 | Catalano ............... G06F 9/5061 |
| 2004/0130292 A1 | 7/2004 | Buchanan et al. |
| 2004/0189248 A1 | 9/2004 | Boskovitch et al. |
| 2005/0024016 A1 | 2/2005 | Breen et al. |
| 2005/0230976 A1 | 10/2005 | Yang |
| 2006/0097698 A1 | 5/2006 | Plett |
| 2006/0116797 A1 | 6/2006 | Moran |
| 2006/0261780 A1 | 11/2006 | Edington et al. |
| 2007/0063675 A1* | 3/2007 | Walline ............... H01M 10/488 320/132 |
| 2007/0124037 A1 | 5/2007 | Moran |
| 2007/0191180 A1 | 8/2007 | Yang |
| 2007/0229032 A1 | 10/2007 | Elder et al. |
| 2008/0093851 A1 | 4/2008 | Maeda et al. |
| 2008/0211459 A1 | 9/2008 | Choi |
| 2008/0238356 A1 | 10/2008 | Batson et al. |
| 2008/0309288 A1 | 12/2008 | Benckenstein et al. |
| 2009/0015206 A1 | 1/2009 | Seman, Jr. et al. |
| 2009/0167247 A1 | 7/2009 | Bai et al. |
| 2009/0222158 A1 | 9/2009 | Kubota et al. |
| 2009/0243540 A1 | 10/2009 | Choi et al. |
| 2010/0076706 A1 | 3/2010 | Elder et al. |
| 2010/0145562 A1 | 6/2010 | Moran |
| 2010/0237829 A1 | 9/2010 | Tatebayashi et al. |
| 2010/0248008 A1 | 9/2010 | Sugawara et al. |
| 2011/0014501 A1 | 1/2011 | Scheucher |
| 2011/0016008 A1* | 1/2011 | Maraz ................ G06Q 20/202 705/21 |
| 2011/0029157 A1* | 2/2011 | Muzaffer ............... B60L 58/16 701/2 |
| 2011/0133920 A1 | 6/2011 | Meadors |
| 2011/0137502 A1 | 6/2011 | Kato et al. |
| 2011/0231049 A1 | 9/2011 | Le Brusq et al. |
| 2011/0244283 A1 | 10/2011 | Seto et al. |
| 2011/0313613 A1 | 12/2011 | Kawahara et al. |
| 2012/0046892 A1 | 2/2012 | Fink |
| 2012/0062187 A1 | 3/2012 | Shim |
| 2012/0068715 A1 | 3/2012 | Martaeng |
| 2012/0074911 A1 | 3/2012 | Murao |
| 2012/0089352 A1 | 4/2012 | Librizzi |
| 2012/0105001 A1 | 5/2012 | Gallegos et al. |
| 2012/0303225 A1 | 11/2012 | Futahashi et al. |
| 2013/0002197 A1 | 1/2013 | Hernandez et al. |
| 2013/0002203 A1 | 1/2013 | Kuraishi |
| 2013/0106356 A1 | 5/2013 | Nakao et al. |
| 2013/0135110 A1 | 5/2013 | Xie et al. |
| 2013/0328530 A1 | 12/2013 | Beaston |
| 2013/0337299 A1 | 12/2013 | Sugawara |
| 2014/0015469 A1 | 1/2014 | Beaston et al. |
| 2014/0015488 A1 | 1/2014 | Despesse |
| 2014/0042973 A1 | 2/2014 | Kawahara et al. |
| 2014/0079963 A1 | 3/2014 | Takeuchi |
| 2014/0123310 A1 | 5/2014 | Cherry et al. |
| 2014/0220396 A1 | 8/2014 | Lee et al. |
| 2014/0225622 A1 | 8/2014 | Kudo et al. |
| 2014/0312828 A1 | 10/2014 | Vo et al. |
| 2015/0104673 A1 | 4/2015 | de Greef et al. |
| 2015/0202973 A1 | 7/2015 | Chang |
| 2015/0349569 A1 | 12/2015 | Christensen et al. |
| 2016/0066278 A1* | 3/2016 | Zhao ................ H04W 52/0261 455/572 |
| 2016/0092847 A1* | 3/2016 | Buchbinder ........... G06Q 10/20 705/26.8 |
| 2016/0099590 A1* | 4/2016 | Velderman ............ H02J 7/0027 320/113 |
| 2016/0111900 A1 | 4/2016 | Beaston et al. |
| 2016/0141894 A1 | 5/2016 | Beaston |
| 2017/0038433 A1 | 2/2017 | Beaston et al. |
| 2017/0040646 A1 | 2/2017 | Beaston |
| 2017/0053244 A1* | 2/2017 | Khalil ................. G06Q 10/103 |
| 2017/0077558 A1 | 3/2017 | Nystrom et al. |
| 2017/0077559 A1 | 3/2017 | Beaston |
| 2017/0106764 A1 | 4/2017 | Beaston et al. |
| 2017/0126032 A1 | 5/2017 | Beaston |
| 2017/0345101 A1 | 11/2017 | Beaston |

FOREIGN PATENT DOCUMENTS

| | | |
|---|---|---|
| CN | 2796215 Y | 7/2006 |
| CN | 1819395 A | 8/2006 |
| CN | 101192755 A | 6/2008 |
| CN | 101222150 A | 7/2008 |
| CN | 102570568 A | 7/2012 |
| CN | 102882263 A | 1/2013 |
| CN | 202663154 U | 1/2013 |
| CN | 103119828 A | 5/2013 |
| CN | 103253143 A | 8/2013 |
| CN | 103812150 A | 5/2014 |
| WO | WO 2012/110497 A1 | 8/2012 |

OTHER PUBLICATIONS

International Preliminary Report on Patentability, dated Sep. 10, 2013, in International Patent Application No. PCT/CN2011/071548; 5 pages.

U.S. Appl. No. 14/678,074, "Electrical Energy Storage Unit and Control System and Applications Thereof," to Beaston, et al., filed Apr. 3, 2015.

U.S. Appl. No. 15/604,329, "World-Wide Web of Networked, Smart, Scalable, Plug & Play Battery Packs Having a Battery Pack Operating System, and Applications Thereof," to Beaston, filed May 24, 2017.

https://www.merriam-webster.com/dictionary/daisy%20chain.

Chris Bakken and Ives Meadors, applicants; U.S. Appl. No. 61/313,548; publicly available as of Jun. 9, 2011 (filed Mar. 12, 2010); 14 pages including filing receipt, provisional cover sheet, and EFS receipt.

English language abstract of Chinese Patent Publication No. CN 1367565 A, published Sep. 4, 2002, 1 page, retrieved from https://worldwide.espacenet.com.

English language abstract of Chinese Patent Publication No. CN 2648617 Y, published Oct. 13, 2004, 1 page, retrieved from https://worldwide.espacenet.com.

English language abstract of Chinese Patent Publication No. CN 2796215 Y, published Jul. 12, 2006, 1 page, retrieved from https://worldwide.espacenet.com.

English language abstract of Chinese Patent Publication No. CN 1819395 A, published Aug. 16, 2006, 1 page, retrieved from https://worldwide.espacenet.com.

English language abstract of Chinese Patent Publication No. CN 101192755 A, published Jun. 4, 2008, 1 page, retrieved from https://worldwide.espacenet.com.

English language abstract of Chinese Patent Publication No. CN 101222150 A, published Jul. 16, 2008, 1 page, retrieved from https://worldwide.espacenet.com.

English language abstract of Chinese Patent Publication No. CN 102570568 A, published Jul. 11, 2012, 1 page, retrieved from https://worldwide.espacenet.com.

English language abstract of Chinese Patent Publication No. CN 102882263 A, published Jan. 16, 2013, 1 page, retrieved from https://worldwide.espacenet.com.

English language abstract of Chinese Patent Publication No. CN 103253143 A, published Aug. 21, 2013, 1 page, retrieved from https://worldwide.espacenet.com.

English language abstract of Chinese Patent Publication No. CN 202663154 U, published Jan. 9, 2013, 1 page, retrieved from https://worldwide.espacenet.com.

English translation for Chinese patent publication No. CN 103119828 A, published May 22, 2013, 13 pages, translated by Google Patents at https://patents.google.com.

(56) References Cited

OTHER PUBLICATIONS

English translation for Chinese patent publication No. CN 103812150 A, published May 21, 2014, 7 pages, translated by Google Patents at https://patents.google.com.
"Bq78412 Pb-Acid Battery State-of-Charge Indicator With Run-Time Display," Texas Instruments SLUAA0—Oct. 2010, 37 pages.

* cited by examiner

2100

| | Battery Pack Warranty Database | User: ABC001<br>Project: ABC<br>BPID: 0048476 |
| --- | --- | --- |
| Portal | Project | Status | History | Exception | Transfer | Account Admin |

Change Password

New Password ☐ Minimum 8 chars., include one special char.

Confirm Password ☐ Same as above

[ Submit Account Change ]

2102 (header/nav area)
2104 (form area)

| | Battery Pack Warranty Database | | User: ABC001<br>Project: ABC<br>BPID: 0048476 |
|---|---|---|---|
| Portal  Project  Status | History | Exception  Transfer | Account Admin |

Battery Pack Exception List

| Project | Serial # | Condition 1 | Reason 1 | Condition 2 | Reason 2 |
|---|---|---|---|---|---|
| Clark Co PUD | 4977540568 | No Contact | Late Report | Invalid | Hi cell V |
| Clark Co PUD | 4977540574 | No Contact | Late Report | Invalid | Hi cell V |
| Clark Co PUD | 4977540598 | No Contact | Late Report | Invalid | Hi cell V |
| Clark Co PUD | 4977540599 | No Contact | Late Report | Invalid | Hi cell V |
| Clark Co PUD | 4977540604 | No Contact | Late Report | Invalid | Hi cell V |
| Clark Co PUD | 4977540508 | No Contact | Late Report | Invalid | Hi cell V |
| Clark Co PUD | 4977540549 | No Contact | Late Report | Invalid | Hi cell V |
| Clark Co PUD | 4977540554 | No Contact | Late Report | | |
| SCE 2mW | 0938764085 | Invalid | Hi cell temp | | |
| SCE 2mW | 0938764087 | Invalid | Hi cell temp | | |
| SCE 2mW | 0938764089 | Invalid | Expired | | |
| SCE 2mW | 0938764095 | Invalid | Expired | | |

Battery Pack Warranty Database

User: ABC001
Project: ABC
BPID: 0048476

Portal | Project | Status | History | Exception | Transfer | Account Admin

2702

Account Administration

| | Username | Page Permissions | | Delete |
|---|---|---|---|---|
| edit | gmadmin | ☒ Transfer | ☒ Account Administration | ☐ |
| edit | debug | ☒ Transfer | ☒ Account Administration | ☐ |
| edit | admin | ☒ Transfer | ☒ Account Administration | ☐ |
| edit | techplus | ☒ Transfer | ☒ Account Administration | ☐ |
| edit | DanielW | ☐ Transfer | ☐ Account Administration | ☐ |
| edit | VirgilB | ☐ Transfer | ☐ Account Administration | ☐ |
| edit | PatE | ☐ Transfer | ☐ Account Administration | ☐ |

Create New User Account     Delete Account

Battery Pack Warranty Database

2900

2902

User: ABC001
Project: ABC
BPID: 0048476

Portal | Project | Status | History | Exception | Transfer | Account Admin

Edit User Account

2904

User Name [               ] Alpha-numeric, no special characters

Password [               ] Minimum 8 chars., include one special char.

Confirm Password [               ] Same as above

2906

Page Permissions
- ☐ Transfer Page
- ☐ Account Administration Page
- ☐ All Account Administration Pages

2908

Project Permissions
- ☐ ABC UTIL
- ☐ XYZ PUD
- ☐ WZXY
- ☐ SOPUD
- ☐ PAC CO
- ☐ PE Inventory

[Submit Account Changes]

FIG. 29

BATTERY PACK MONITORING AND WARRANTY TRACKING SYSTEM

BACKGROUND

Field

Embodiments of the systems and methods described herein are generally related to warranty applications for battery packs.

Background

Large, multi-cell battery packs typically cost substantially more than common consumer batteries, such as cellular phone and laptop batteries. Replacement of defective battery packs can lead to significant expense for a consumer, and therefore, consumers expect proper function of each battery pack. A warranty may provide assurance to the purchaser of a battery pack in case of any defects.

SUMMARY

Systems and methods are disclosed for monitoring battery usage information. In an embodiment, battery usage data is received from a battery energy storage system that includes a battery pack. The battery usage data may include battery identification information, one or more battery sensor measurements for a period of time, and a cumulative warranty value for the battery pack. A project to which the battery pack belongs may then be determined based on the received battery identification information. Finally, the battery usage data may be stored in a warranty database. The warranty database may store battery usage data for a plurality of battery packs. The warranty database may further be partitioned by project, and the battery usage data may be stored in a partition of the warranty database for the determined project.

In an embodiment, a request may be received from a user for battery usage data stored in the warranty database. It is then verified that the requested battery usage data is authorized to be accessed by the user. Upon successful verification, the requested battery usage data may be provided to a graphical user interface for viewing.

In an embodiment, when a battery pack is determined to be defective, an alert may be received. The stored cumulative warranty value may then be compared to a predefined threshold value. A warranty for the battery pack may be determined to be expired when the cumulative warranty value exceeds the threshold value.

Further embodiments, features, and advantages of the invention, as well as the structure and operation of the various embodiments, are described in detail below with reference to accompanying drawings.

BRIEF DESCRIPTION OF THE DRAWINGS

The accompanying drawings, which are incorporated herein and form part of the specification, illustrate the present disclosure and, together with the description, further serve to explain the principles of the disclosure and to enable a person skilled in the relevant art to make and use the disclosure.

FIG. 21 is an example user interface for changing a user password, according to an embodiment.

FIG. 25 is an example user interface for viewing battery pack exceptions, according to an embodiment.

FIG. 27 is an example administrative user interface for assigning task permissions, according to an embodiment.

FIG. 28 is an example administrative user interface for creating a new user account, according to an embodiment.

FIG. 29 is an example user interface for editing a user account, according to an embodiment.

In the drawings, like reference numbers may indicate identical or functionally similar elements.

DETAILED DESCRIPTION

While the present disclosure is described herein with illustrative embodiments for particular applications, it should be understood that the disclosure is not limited thereto. A person skilled in the art with access to the teachings provided herein will recognize additional modifications, applications, and embodiments within the scope thereof and additional fields in which the disclosure would be of significant utility.

The terms "embodiments" or "example embodiments" do not require that all embodiments include the discussed feature, advantage, or mode of operation. Alternate embodiments may be devised without departing from the scope or spirit of the disclosure, and well-known elements may not be described in detail or may be omitted so as not to obscure the relevant details. In addition, the terminology used herein is for the purpose of describing particular embodiments only and is not intended to be limiting. For example, as used herein, the singular forms "a," "an" and "the" are intended to include the plural forms as well, unless the context clearly indicates otherwise. It will be further understood that the terms "comprises," "comprising," "includes" and "including," when used herein, specify the presence of stated features, integers, steps, operations, elements, and components, but do not preclude the presence or addition of one or more other features, integers, steps, operations, elements, components, or groups thereof.

Figure 1A:
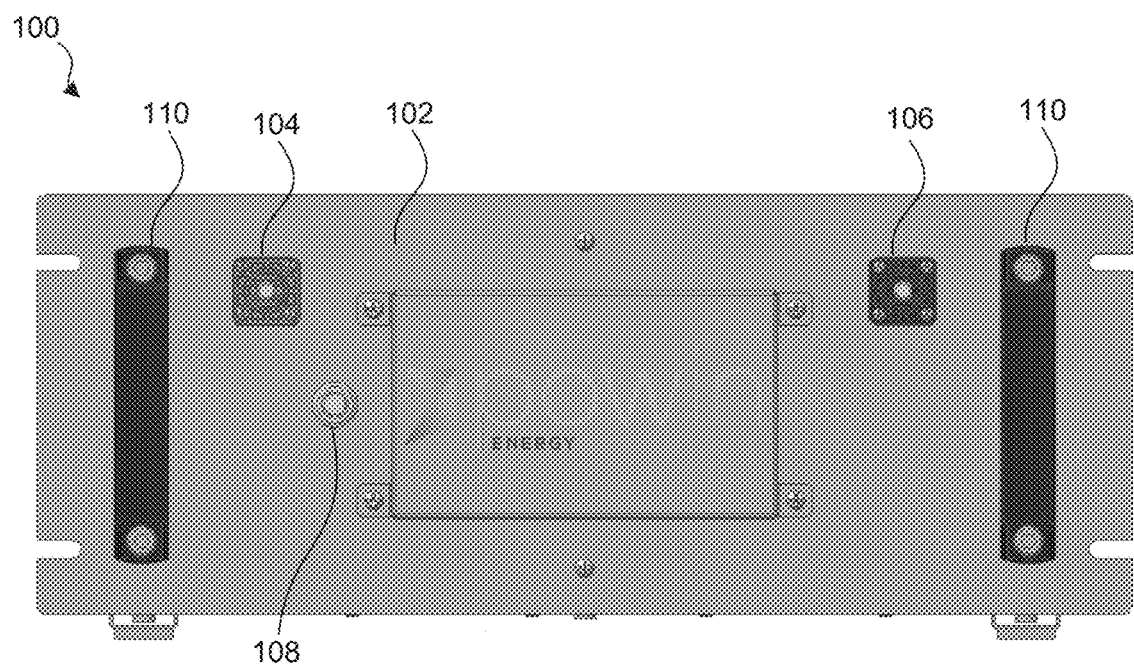
FIGS. 1A, 1B, and 1C are diagrams illustrating an example battery pack.
Figure 1B:
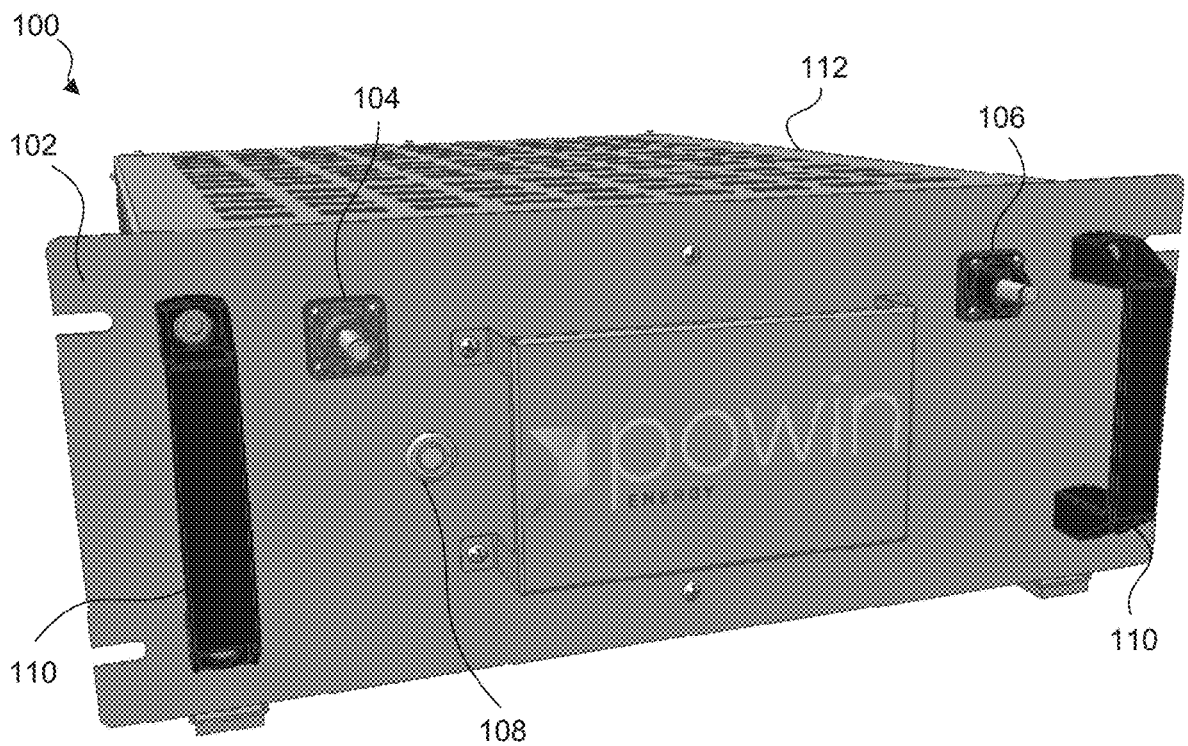
Figure 1C:
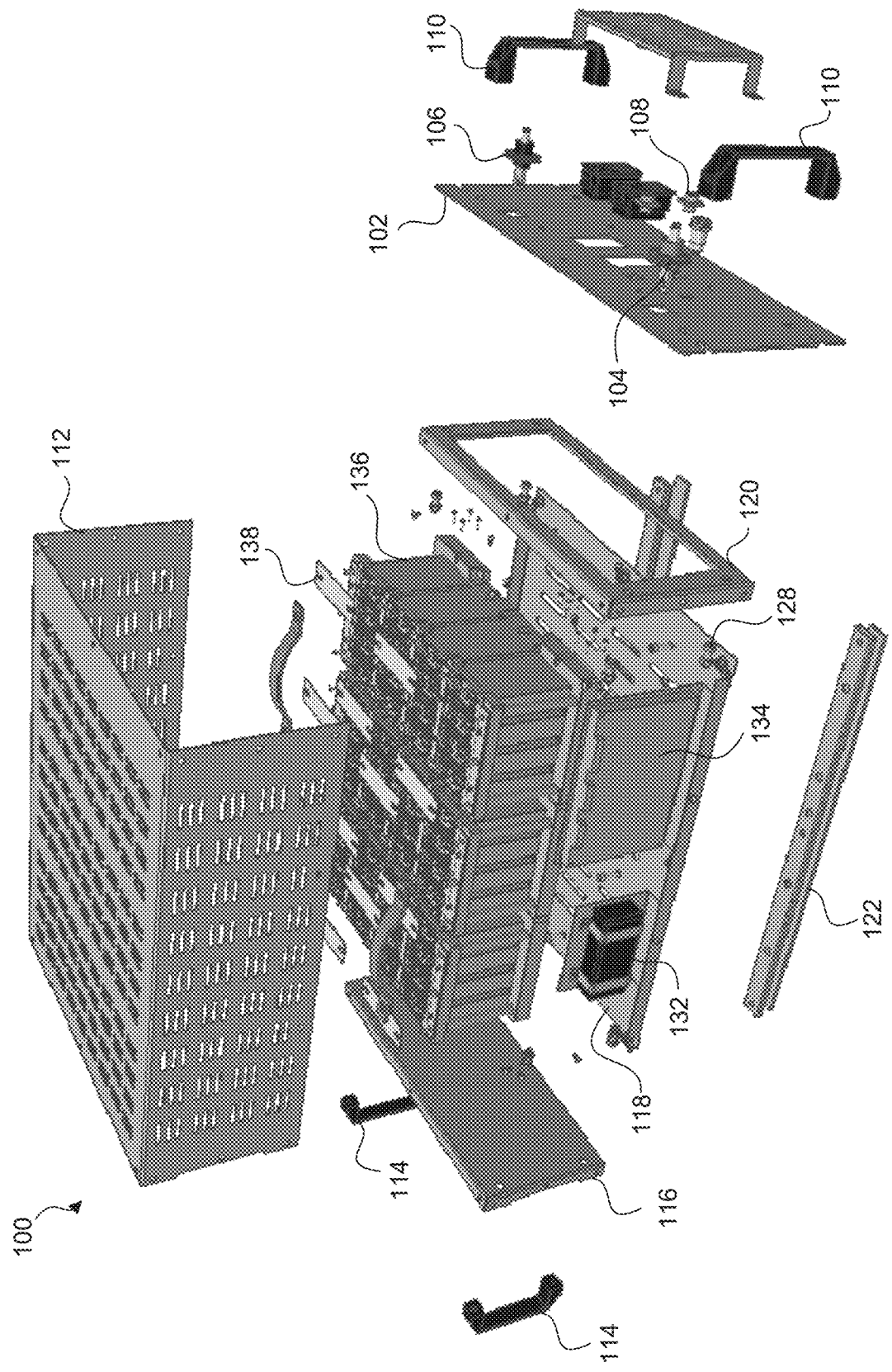

FIGS. 1A, 1B, and 1C are diagrams that illustrate an example battery pack 100 according to an embodiment of the disclosure. Specifically, FIGS. 1A and 1B depict front views of battery pack 100, and FIG. 1C depicts an exploded view of battery pack 100. As shown in FIGS. 1A-C, the housing of battery pack 100 may include a front panel 102, a lid or cover 112, a back panel 116, and a bottom 118. The lid 112, which includes left and right side portions, may include a plurality of air vents to facilitate air flow through battery pack 100 and aid in cooling the internal components of battery pack 100. In a non-limiting embodiment, the lid 112 is "U"-shaped and may be fabricated from a single piece of metal, plastic, or any other material known to one of ordinary skill in the art.

The housing of battery pack 100 may be assembled using fasteners 128 shown in FIG. 1C, which may be screws and bolts or any other fastener known to one of ordinary skill in the art. The housing of battery pack 100 may also include front handles 110 and back handles 114. As shown in FIG. 1C, front plate 102 may be coupled to lid 112 and bottom 118 via front panel mount 120. In one embodiment, battery pack 100 is implemented as a rack-mountable equipment module. For example, battery pack 100 may be implemented as a standard 19-inch rack (e.g., front panel 102 having a width of 19 inches, and battery pack 100 having a depth of between 22 and 24 inches and a height of 4 rack units or "U," where U is a standard unit that is equal to 1.752 inches). As shown in FIG. 1C, battery pack 100 may include one or more mounts 122 attached to bottom 118. Mount 122 may be used to secure battery pack 100 in a rack in order to arrange a plurality of battery packs in a stacked configuration (shown in FIG. 5).

In FIGS. 1A-C, battery pack 100 includes a power connector 104 for connecting to the negative terminal of the battery pack and a power connector 106 for connecting to a positive terminal of the battery pack. As shown in FIGS. 1A and 1B, the power connectors 104 and 106 may be provided on the front plate 102 of battery pack 100. Power cables (not shown) may be attached to the power connectors 104 and 106 and used to add or remove energy from the battery pack 100.

The front plate 102 of battery pack 100 may also include a status light and reset button 108. In one embodiment, status button 108 is a push button that can be depressed to reset or restart battery pack 100. In one embodiment, the outer ring around the center of button 108 may be illuminated to indicate the operating status of battery pack 100. The illumination may be generated by a light source, such as one or more light emitting diodes, that is coupled to or part of the status button 108. In this embodiment, different color illumination may indicate different operating states of the battery pack. For example, constant or steady green light may indicate that battery pack 100 is in a normal operating state; flashing or strobing green light may indicate that battery pack 100 is in a normal operating state and that battery pack 100 is currently balancing the batteries; constant or steady yellow light may indicate a warning or that battery pack 100 is in an error state; flashing or strobing yellow light may indicate a warning or that battery pack 100 is in an error state and that battery pack 100 is currently balancing the batteries; constant or steady red light may indicate that the battery pack 100 is in an alarm state; flashing or strobing red light may indicate that battery pack 100 needs to be replaced; and no light emitted from the status light may indicate that battery pack 100 has no power and/or needs to be replaced. In some embodiments, when the status light emits red light (steady or flashing) or no light, connectors in battery pack 100 or in an external controller are automatically opened to prevent charging or discharging of the batteries. As would be apparent to one of ordinary skill in the art, any color, strobing technique, etc., of illumination to indicate the operating status of battery pack 100 is within the scope of this disclosure.

Turning to FIG. 1C, example components that are disposed inside the housing of battery pack 100 are shown, including (but not limited to) balancing charger 132, battery pack controller (BPC) 134, and battery module controller (BMC) 138. Balancing charger 132 may be a power supply, such as a DC power supply, and may provide energy to all of the battery cells in a battery pack. BMC 138 is coupled to battery module 136 and may selectively discharge energy from the battery cells that are included in battery module 136, as well as take measurements (e.g., voltage and temperature) of battery module 136. BPC 134 may control balancing charger 132 and BMC 138 to balance or adjust the voltage and/or state of charge of a battery module to a target voltage and/or state of charge value.

As shown, battery pack 100 includes a plurality of battery modules and a BMC (e.g., battery module controller 138) is coupled to each battery module (e.g., battery module 136). In one embodiment, which is described in more detail below, n BMCs (where n is greater than or equal to 2) can be daisy-chained together and coupled to a BPC to form a single-wire communication network. In this example arrangement, each BMC may have a unique address and the BPC may communicate with each of the BMCs by addressing one or more messages to the unique address of any desired BMC. The one or more messages (which include the unique address of the BMC) may include an instruction to, for example, remove energy from a battery module, to stop removing energy from a battery module, to measure and report the temperature of the battery module, and to measure and report the voltage of the battery module. In one embodiment, BPC 134 may obtain measurements (e.g., temperature, voltage) from each of the BMCs using a polling technique. BPC 134 may calculate or receive (e.g., from a controller outside of battery pack 100) a target voltage for battery pack 100, and may use the balancing charger 132 and the network of BMCs to adjust each of the battery modules to the target voltage. Thus, battery pack 100 may be considered a smart battery pack, able to self-adjust its battery cells to a target voltage.

The electrical wiring that connects various components of battery pack 100 has been omitted from FIG. 1C to enhance viewability. In the illustrated embodiment, balancing charger 132 and battery pack controller 134 may be connected to or mounted on the bottom 118. While shown as mounted on the left side of battery pack 100, balancing charger 132 and battery pack controller 134, as well as all other components disposed in battery pack 100, may be disposed at any location within battery pack 100.

Battery module 136 includes a plurality of battery cells. Any number of battery cells may be included in battery module 136. Example battery cells include, but are not limited to, Li ion battery cells, such as 18650 or 26650 battery cells. The battery cells may be cylindrical battery cells, prismatic battery cells, or pouch battery cells, to name a few examples. The battery cells or battery modules may be, for example, up to 100 AH battery cells or battery modules. In some embodiments, the battery cells are connected in series/parallel configuration. Example battery cell configurations include, but are not limited to, 1P16S configuration, 2P16S configuration, 3P16S configuration, 4P16S configuration, 1P12S configuration, 2P12S configuration, 3P12S configuration, and 4P12S configuration. Other configurations known to one of ordinary skill in the art are within the scope of this disclosure. Battery module 136 includes positive and negative terminals for adding energy to and removing energy from the plurality of battery cells included therein.

As shown in FIG. 1C, battery pack 100 includes 12 battery modules that form a battery assembly. In another embodiment, battery pack 100 may include 16 battery modules that form a battery assembly. In other embodiments, battery pack 100 may include 20 battery modules or 25 battery modules that form a battery assembly. As would be apparent to one of ordinary skill in the art, any number of battery modules may be connected to form the battery assembly of battery pack 100. In battery pack 100, the battery modules that are arranged as a battery assembly may be arranged in a series configuration.

Figure 2:
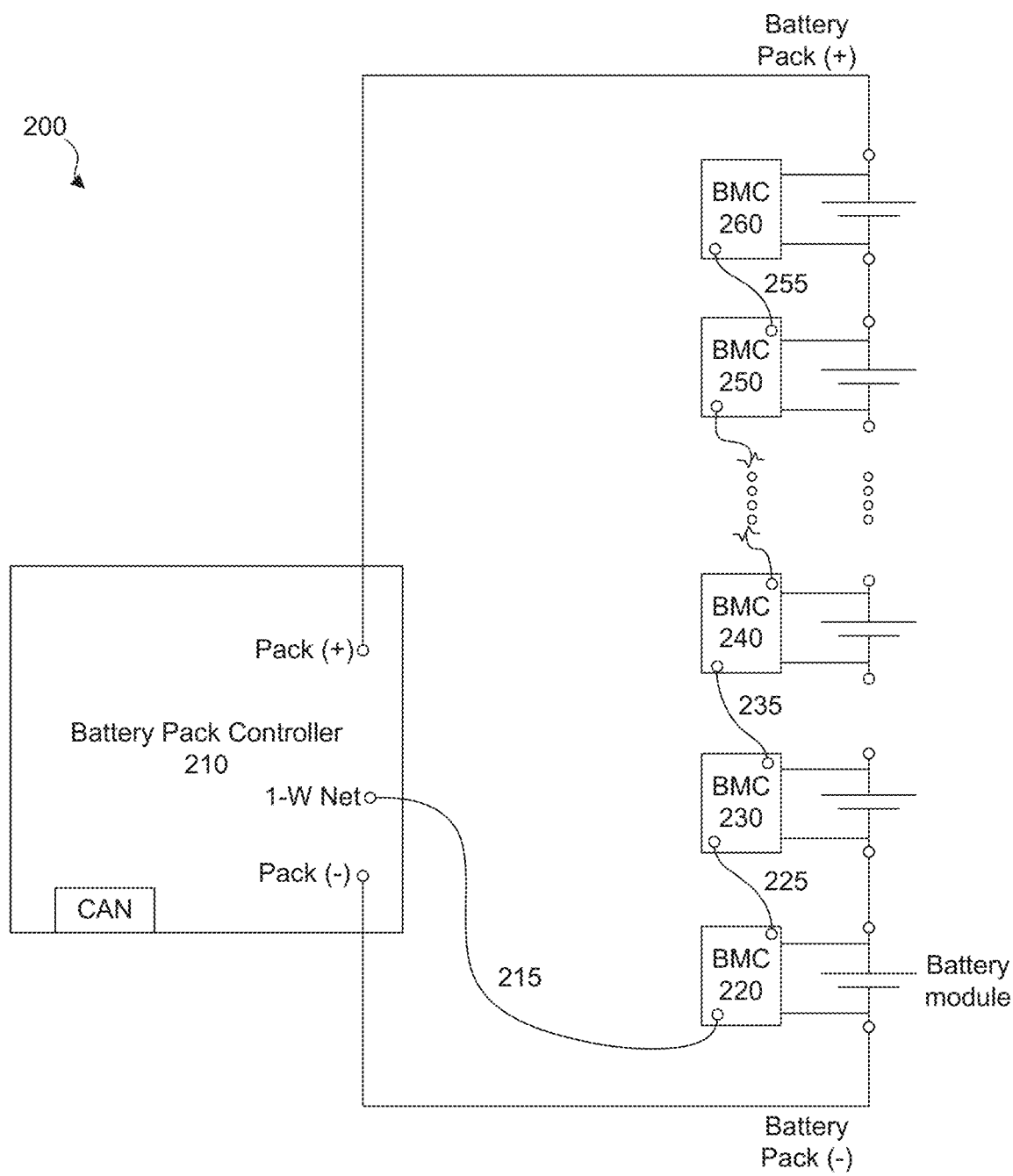
FIG. 2 is a diagram illustrating an example communication network formed by a battery pack controller and a plurality of battery module controllers.

In FIG. 1C, battery module controller 138 is coupled to battery module 136. Battery module controller 138 may be couple to the positive and negative terminals of battery module 136. Battery module controller 138 may be configured to perform one, some, or all of the following functions: remove energy from battery module 136, measure the voltage of battery module 136, and measure the temperature of battery module 136. As would be understood by one of ordinary skill in the art, battery module controller 138 is not limited to performing the functions just described. In one embodiment, battery module controller 138 is implemented as one or more circuits disposed on a printed circuit board. In battery pack 100, one battery module controller is coupled to or mounted on each of the battery modules in battery pack 100. Additionally, each battery module controller may be coupled to one or more adjacent battery module controllers via wiring to form a communication network. As illustrated in FIG. 2, n battery module controllers (where n is a whole number greater than or equal to two) may be daisy-chained together and coupled to a battery pack controller to form a communication network.

FIG. 2 is a diagram illustrating an example communication network 200 formed by a battery pack controller and a plurality of battery module controllers. In FIG. 2, battery pack controller (BPC) 210 is coupled to n battery module controllers (BMCs) 220, 230, 240, 250, and 260. Said another way, n battery module controllers (where n is a whole number greater than or equal to two) are daisy-chained together and coupled to battery pack controller 210 to form communication network 200, which may be referred to as a distributed, daisy-chained battery management system (BMS). Specifically, BPC 210 is coupled to BMC 220 via communication wire 215, BMC 220 is coupled to BMC 230 via communication wire 225, BMC 230 is coupled to BMC 240 via communication wire 235, and BMC 250 is coupled to BMC 260 via communication wire 255 to form the communication network. Each communication wire 215, 225, 235, and 255 may be a single wire, forming a single-wire communication network that allows the BCM 210 to communicate with each of the BCMs 220-260, and vice versa. As would be apparent to one of skill in the art, any number of BMCs may be daisy chained together in communication network 200.

Each BMC in the communication network 200 may have a unique address that BCP 210 uses to communicate with individual BMCs. For example, BMC 220 may have an address of 0002, BMC 230 may have an address of 0003, BMC 240 may have an address of 0004, BMC 350 may have an address of 0005, and BMC 360 may have an address of 0006. BPC 210 may communicate with each of the BMCs by addressing one or more messages to the unique address of any desired BMC. The one or more messages (which include the unique address of the BMC) may include an instruction to, for example, remove energy from a battery module, to stop removing energy from a battery module, to measure and report the temperature of the battery module, and to measure and report the voltage of the battery module. BPC 210 may poll the BMCs to obtain measurements related to the battery modules of the battery pack, such as voltage and temperature measurements. Any polling technique known to one of skill in the art may be used. In some embodiments, BPC 210 continuously polls the BMCs for measurements in order to continuously monitor the voltage and temperature of the battery modules in battery pack 100.

For example, BPC 210 may seek to communicate with BMC 240, e.g., in order to obtain temperature and voltage measurements of the battery module that BMC 240 is mounted on. In this example, BPC 210 generates and sends a message (or instruction) addressed to BMC 240 (e.g., address 0004). The other BMCs in the communication network 200 may decode the address of the message sent by BPC 210, but only the BMC (in this example, BMC 240) having the unique address of the message may respond. In this example, BMC 240 receives the message from BPC 210 (e.g., the message traverses communication wires 215, 225, and 235 to reach BMC 240), and generates and sends a response to BPC 210 via the single-wire communication network (e.g., the response traverses communication wires 235, 225, and 215 to reach BPC 210). BPC 210 may receive the response and instruct BMC 240 to perform a function (e.g., remove energy from the battery module it is mounted on). In other embodiments, other types of communication networks (other than communication network 200) may be used, such as, for example, an RS232 or RS485 communication network.

Figure 3:
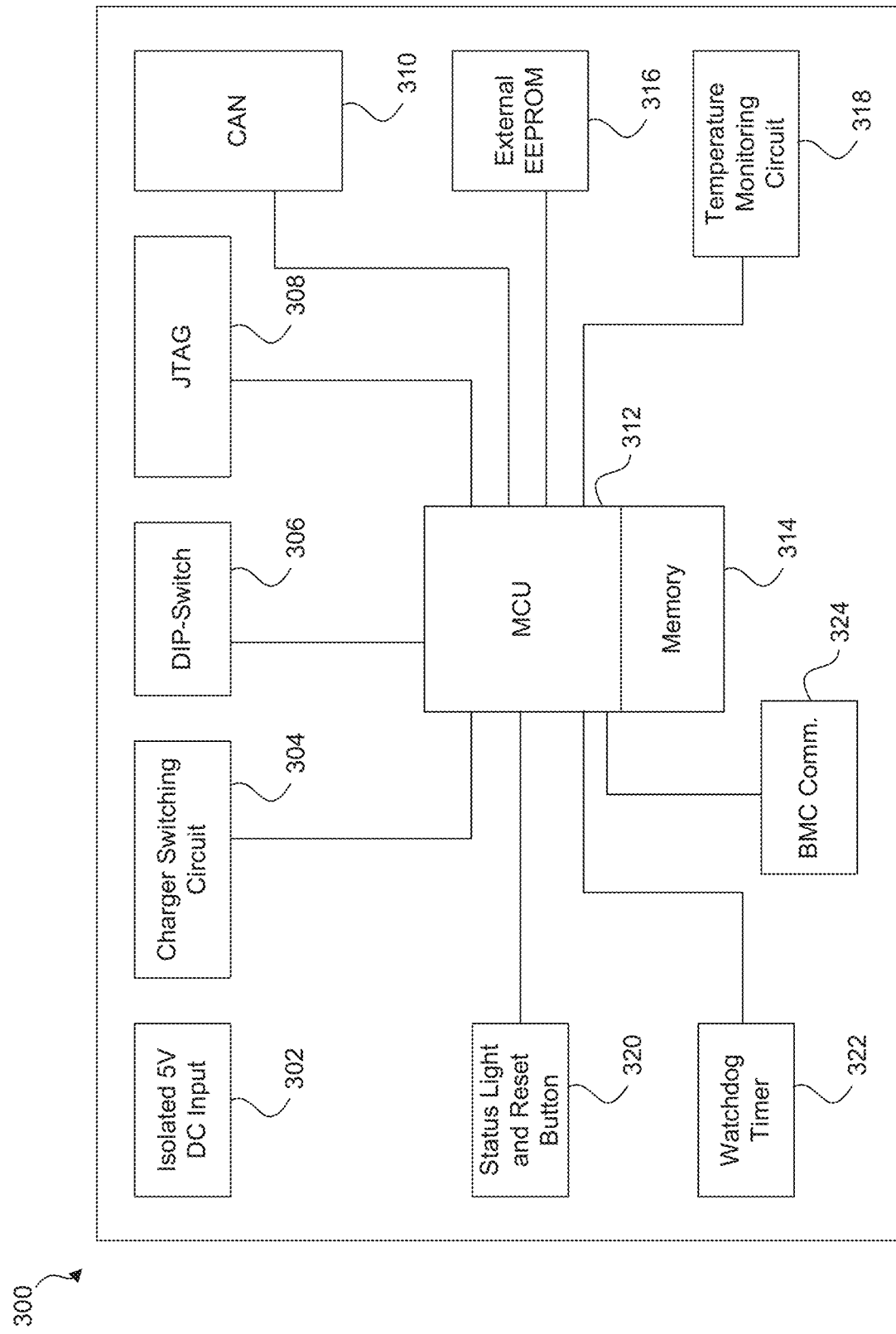
FIG. 3 is a diagram illustrating an example battery pack controller.

FIG. 3 is a diagram illustrating an example battery pack controller 300 according to an embodiment of the disclosure. Battery pack controller 134 of FIG. 1C may be implemented as described in accordance with battery pack controller 300 of FIG. 3. Battery pack controller 210 of FIG. 2 may be implemented as described in accordance with battery pack controller 300 of FIG. 3.

As shown in FIG. 3, the example battery pack controller 300 includes a DC input 302 (which may be an isolated 5V DC input), a charger switching circuit 304, a DIP-switch 306, a JTAG connection 308, a CAN (CANBus) connection 310, a microprocessor unit (MCU) 312, memory 314, an external EEPROM 316, a temperature monitoring circuit 318, a status light and reset button 320, a watchdog timer 322, and a battery module controller (BMC) communication connection 324.

In one embodiment, battery pack controller 300 may be powered from energy stored in the battery cells. Battery pack controller 300 may be connected to the battery cells by DC input 302. In other embodiments, battery pack controller 300 may be powered from an AC to DC power supply connected to DC input 302. In these embodiments, a DC-DC power supply may then convert the input DC power to one or more power levels appropriate for operating the various electrical components of battery pack controller 300.

In the example embodiment illustrated in FIG. 3, charger switching circuit 304 is coupled to MCU 312. Charger switching circuit 304 and MCU 312 may be used to control operation of a balancing charger, such as balancing charger 132 of FIG. 1C. As described above, a balancing charger may add energy to the battery cells of the battery pack. In an embodiment, temperature monitoring circuit 318 includes one or more temperature sensors that can monitor the temperature heat sources within the battery pack, such as the temperature of the balancing charger that is used to add energy to the battery cells of the battery pack.

Battery pack controller 300 may also include several interfaces and/or connectors for communicating. These interfaces and/or connectors may be coupled to MCU 312 as shown in FIG. 3. In one embodiment, these interfaces and/or connectors include: DIP-switch 306, which may be used to set a portion of software bits used to identify battery pack controller 300; JTAG connection 308, which may be used for testing and debugging battery pack controller 300; CAN (CANBus) connection 310, which may be used to communicate with a controller that is outside of battery pack 100; and BMC communication connection 324, which may be used to communicate with one or more battery module controllers, such as a distributed, daisy-chained network of battery module controllers (e.g., FIG. 2). For example, battery pack controller 300 may be coupled to a communication wire, e.g., communication wire 215 of FIG. 2, via BMC communication connection 324.

Battery pack controller 300 also includes an external EEPROM 316. External EEPROM 316 may store values, measurements, etc., for the battery pack. These values, measurements, etc., may persist when power of battery pack 100 is turned off (i.e., will not be lost due to loss of power). External EEPROM 316 may also store executable code or instructions, such as executable code or instructions to operate microprocessor unit 312.

Microprocessor unit (MCU) 312 is coupled to memory 314. MCU 312 is used to execute an application program that manages the battery pack. As described herein, in an embodiment the application program may perform the following functions (but is not limited thereto): monitor the voltage and temperature of the battery cells of battery pack 100, balance the battery cells of battery pack 100, monitor and control (if needed) the temperature of battery pack 100, handle communications between battery pack 100 and other components of an electrical energy storage system (see FIG. 5 below), and generate warnings and/or alarms, as well as take other appropriate actions, to protect the battery cells of battery pack 100.

As described above, a battery pack controller may obtain temperature and voltage measurements from battery module controllers. The temperature readings may be used to ensure that the battery cells are operated within their specified temperature limits and to adjust temperature related values calculated and/or used by the application program executing on MCU 312. Similarly, the voltage readings are used, for example, to ensure that the battery cells are operated within their specified voltage limits.

Watchdog timer 322 is used to monitor and ensure the proper operation of battery pack controller 300. In the event that an unrecoverable error or unintended infinite software loop should occur during operation of battery pack controller 300, watchdog timer 322 can reset battery pack controller 300 so that it resumes operating normally. Status light and reset button 320 may be used to manually reset operation of battery pack controller 300. As shown in FIG. 3, status light and reset button 320 and watchdog timer 322 may be coupled to MCU 312.

Figure 4:
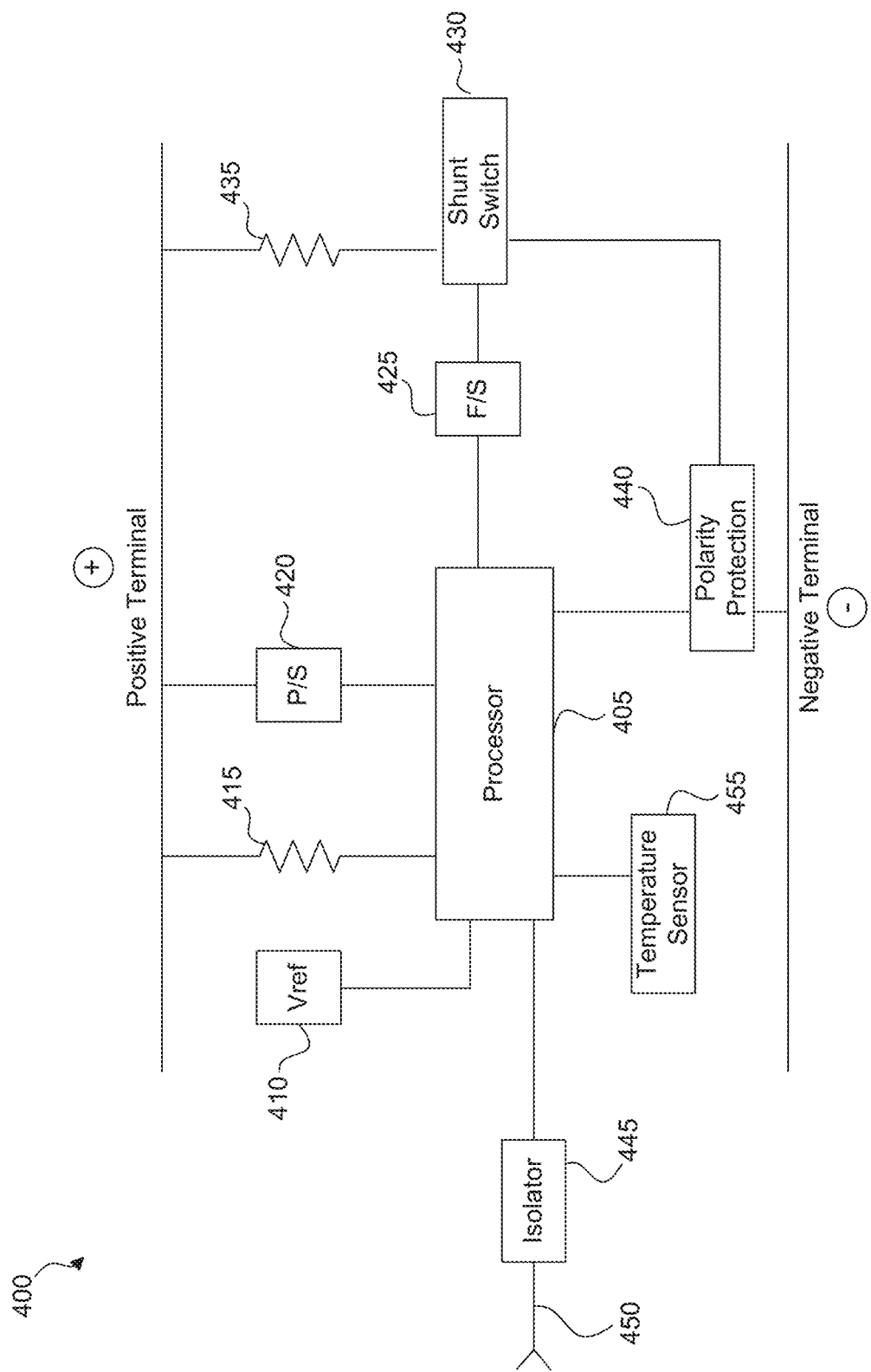
FIG. 4 is a diagram illustrating an example battery module controller.

FIG. 4 illustrates an example battery module controller 400 according to an embodiment of the disclosure. Battery module controller 138 of FIG. 1C may be implemented as described in accordance with battery module controller 400 of FIG. 4. Each of battery module controllers 220, 230, 240, 250, and 260 of FIG. 2 may be implemented as described in accordance with battery module controller 400 of FIG. 4. Battery module controller 400 may be mounted on a battery module of a battery pack and may perform the following functions (but is not limited thereto): measure the voltage of the battery module, measure the temperature of the battery module, and remove energy from (discharge) the battery module.

In FIG. 4, the battery module controller 400 includes processor 405, voltage reference 410, one or more voltage test resistors 415, power supply 420, fail safe circuit 425, shunt switch 430, one or more shunt resistors 435, polarity protection circuit 440, isolation circuit 445, and communication wire 450. Processor 405 controls the battery module controller 400. Processor 405 receives power from the battery module that battery module controller 400 is mounted on via the power supply 420. Power supply 420 may be a DC power supply. As shown in FIG. 4, power supply 420 is coupled to the positive terminal of the battery module, and provides power to processor 405. Processor 405 is also coupled to the negative terminal of the battery module via polarity protection circuit 440, which protects battery module controller 400 in the event that it is improperly mounted on a battery module (e.g., the components of battery module controller 400 that are coupled to the positive terminal in FIG. 4 are improperly coupled to the negative terminal and vice versa).

Battery module controller 400 may communicate with other components of a battery pack (e.g., a battery pack controller) via communication wire 450, which may be a single wire. As described with respect to the example communication network of FIG. 2, communication wire 450 may be used to daisy chain battery module controller 400 to a battery pack controller and/or one or more other battery module controllers to form a communication network. As such, battery module controller 400 may send and receive messages (including instructions sent from a battery pack controller) via communication wire 450. When functioning as part of a communication network, battery module controller 400 may be assigned a unique network address, which may be stored in a memory device of the processor 405.

Battery module controller 400 may be electrically isolated from other components that are coupled to the communication wire (e.g., battery pack controller, other battery module controllers) via isolation circuit 445. In FIG. 4, isolation circuit 445 is disposed between communication wire 450 and processor 405. Isolation circuit 445 may capacitively couple processor 405 to communication wire 450, or may provide other forms of electrical isolation known to those of skill in the art.

As explained above, battery module controller 400 may measure the voltage of the battery module it is mounted on. As shown in FIG. 4, processor 405 is coupled to voltage test resistor 415, which is coupled to the positive terminal of the battery module. Processor 405 may measure the voltage across voltage test resistor 415, and compare this measured voltage to voltage reference 410 to determine the voltage of the battery module. As described with respect to FIG. 2, battery module controller 400 may be instructed to measure the voltage of the battery module by a battery pack controller. After performing the voltage measurement, processor 405 may report the voltage measurement to a battery pack controller via communication wire 450.

Battery module controller 400 may also remove energy from the battery module that it is mounted on. As shown in FIG. 4, processor 405 is coupled to fail safe circuit 425, which is coupled to shunt switch 430. Shunt switch 430 is also coupled to the negative terminal via polarity protection circuit 440. Shunt resistor 435 is disposed between the positive terminal of the battery module and shunt switch 430. In this embodiment, when shunt switch 430 is open, shunt resistor 435 is not applied across the positive and negative terminals of the battery module; and when shunt switch 430 is closed, shunt resistor 435 is applied across the positive and negative terminals of the battery module in order to remove energy from the battery module. Processor 405 may instruct shunt switch 430 to selectively apply shunt resistor 435 across the positive and negative terminals of the battery module in order to remove energy from the battery module. In one embodiment, processor 405 instructs shunt switch 430 at regular intervals (e.g., once every 30 seconds) to apply shunt resistor 435 in order to continuously discharge the battery module.

Fail safe circuit 425 may prevent shunt switch 430 from removing too much energy from the battery module. In the event that processor 405 malfunctions, fail safe circuit 425 may instruct shunt switch 430 to stop applying shunt resistor 435 across the positive and negative terminals of the battery module. For example, processor 405 may instruct shunt switch 430 at regular intervals (e.g., once every 30 seconds) to apply shunt resistor 435 in order to continuously discharge the battery module. Fail safe circuit 425, which is disposed between processor 405 and shunt switch 430, may monitor the instructions processor 405 sends to shunt switch 430. In the event that processor 405 fails to send a scheduled instruction to the shunt switch 430 (which may be caused by a malfunction of processor 405), fails safe circuit 425 may instruct or cause shunt switch 430 to open, preventing further discharge of the battery module.

Battery module controller 400 of FIG. 4 also includes temperature sensor 455, which may measure the temperature of the battery module that battery module controller 400 is connected to. As depicted in FIG. 4, temperature sensor 455 is coupled to processor 405, and may provide temperature measurements to processor 405. Any temperature sensor known to those skilled in the art may be used to implement temperature sensor 455.

Figure 5:
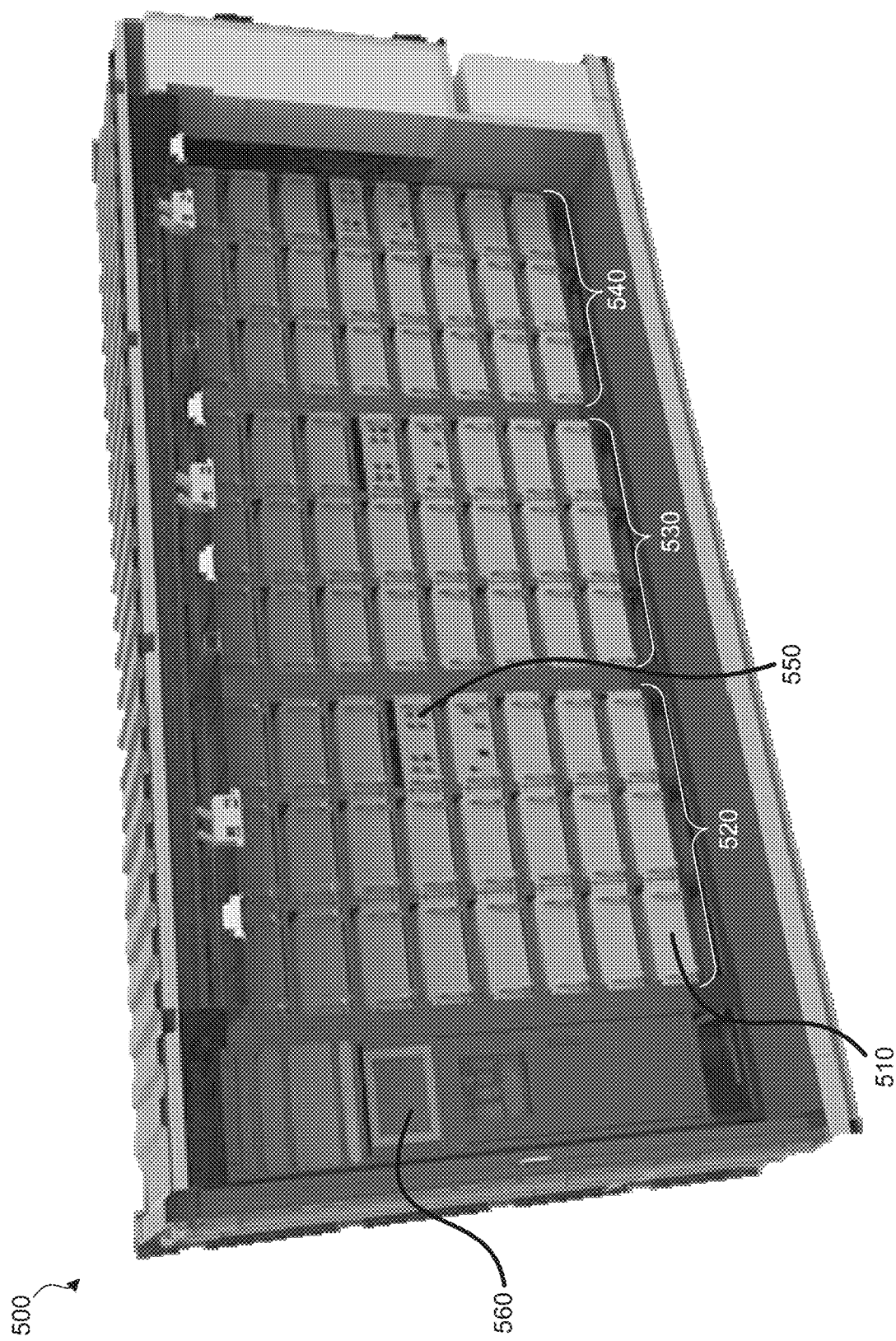
FIG. 5 is a diagram illustrating an example battery energy storage system.

FIG. 5 is a diagram that illustrates battery energy storage system 500. Battery energy storage system 500 can be operated as a stand-alone system, or it can be combined together with other battery energy storage systems to form a part of a larger battery energy storage system. Battery energy storage system 500 may be highly scalable, ranging from a small kilowatt-hour size battery energy storage system to a megawatt-hour size battery energy storage system. In the embodiment illustrated in FIG. 5, battery energy storage system 500 is housed in a container (similar to a shipping container) and is movable (e.g., transported by a truck). Other housings known to those skilled in the art are within the scope of this disclosure.

As shown in FIG. 5, battery energy storage system 500 includes a plurality of battery packs, such as battery pack 510. Battery pack 510 may be implemented as described with respect to FIGS. 1-4 above. As explained above, each battery pack includes battery cells (which may be arranged into battery modules), a battery pack controller that monitors the battery cells, a balancing charger (e.g., DC power supply) that adds energy to each of the battery cells, and a distributed, daisy-chained network of battery module controllers that may take certain measurements of and remove energy from the battery cells. As explained, the battery pack controller may control the network of battery module controllers and the balancing charger to control the state-of-charge or voltage of a battery pack.

The battery packs of battery energy storage system 500 may be mounted on racks. A plurality of battery packs may be connected in series, which may be referred to as a string of battery packs or a battery pack string. For example, battery pack 510 may be connected in series with other battery packs to form battery pack string 520. FIG. 5 illustrates three battery pack strings 520, 530, and 540. A plurality of battery pack strings may be connected in parallel to form a battery energy storage system.

Each battery pack string may be controlled by a controller, which may be referred to as a string controller. For example, battery pack string 520 may be controlled by string controller 550. As its name suggests, a string controller may monitor and control the battery packs of a string. In an embodiment, the plurality of string controllers may be linked together using CAN (CANBus) communications, which enables the string controllers to operate together as part of an overall network of battery string controllers. This network of battery string controllers can manage and operate any size battery system such as, for example, a multi-megawatt-hour centralized battery energy storage system. In an embodiment, one of the networked battery string controllers (such as battery string controller 550) can be designated as a master battery string controller and used to control battery charge and discharge operations by sending commands that operate one or more inverters and/or chargers connected to the battery system. Alternatively, a computer or system controller 560 may be coupled to and control the string controllers in a battery energy storage system. A string controller may communicate with the battery pack controller in each of the battery packs in its string (e.g., string controller 550 may communicate with the BPC in battery pack 510) to monitor and control charging and discharging of the battery packs. In one embodiment, a string controller sends each battery pack in its string a target voltage, and the battery packs adjust the battery cells to the target voltage. A string controller and BPC may also communicate measurements (e.g., voltage, temperature, current values), and also perform diagnostic procedures, startup procedures, and the like.

In an embodiment battery energy storage system 500 includes or is otherwise coupled to a bi-directional power converter. The bi-directional power converter may charge and discharge battery packs using commands issued, for example, via a computer over a network (e.g. the Internet, an Ethernet, etc.). In one embodiment, an operator at a utility may use a networked computer to control battery energy storage system 500. Both the real power and the reactive power of the bi-directional power converter may be controlled. Also, in some embodiments, the bi-directional power converter can be operated as a backup power source when grid power is not available and/or the battery energy storage unit is disconnected from the power grid.

Battery energy storage system 500 may be used as a part of a renewable wind energy system, which includes wind turbines. Energy from the wind turbines may be stored in and selectively discharged from battery energy storage system 500. Similarly, battery energy storage system 500 may be used as a part of a renewable solar energy system, which includes a solar array. Energy from the solar array may be stored in and selectively discharged from the battery energy storage system 500. Additionally, battery energy storage system 500 may be used as a part of a grid energy system (power grid), which includes electrical equipment. Energy from grid energy system may be stored in and selectively discharged from battery energy storage system 500.

In an embodiment, a warranty based on battery usage for a battery pack, such as battery pack 100 of FIGS. 1A-C, may take into account various data associated with the battery pack, such as but not limited to, charge and discharge rates, battery temperature, and battery voltage. A warranty tracker embedded in the battery pack may use this data to compute a warranty value representing battery usage for a period of time. Calculated warranty values may be aggregated over the life of the battery, and the cumulative value may be used to determine warranty coverage. With this approach, the warranty may not only factor in the total discharge of the battery pack, but also the manner in which the battery pack has been used. Various data used to calculate warranty values, according to an embodiment, are discussed further with respect to FIGS. 6-9.

Figure 6:
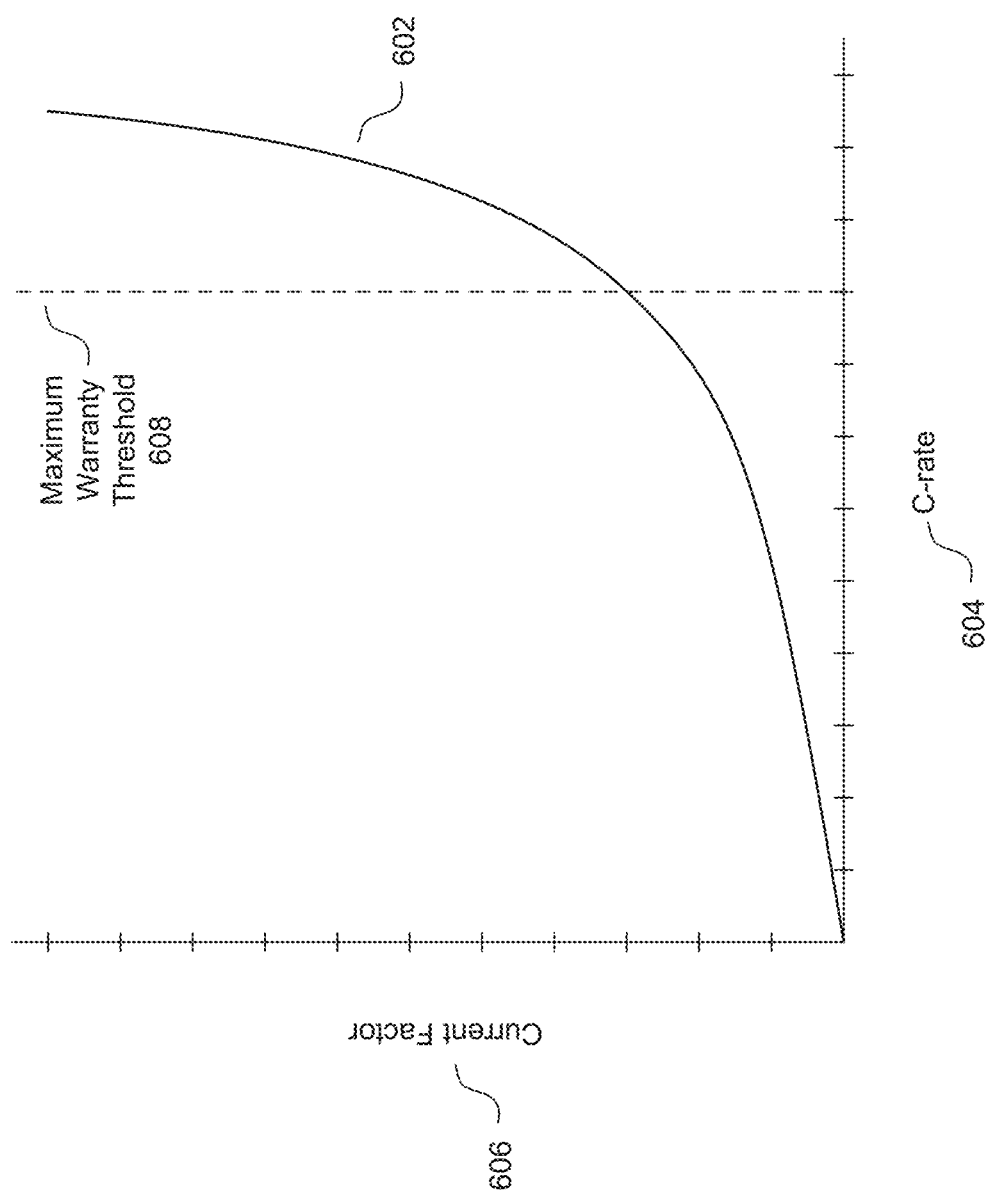
FIG. 6 is a diagram illustrating a correlation between an electric current measurement and a current factor used in the calculation of a warranty value, according to an embodiment.

Charge and discharge rates of a battery pack are related to and can be approximated or determined based on the amount of electric current flowing into and out of the battery pack, which can be measured. In general, higher charge and discharge rates may produce more heat (than lower rates), which may cause stress on the battery pack, shorten the life of the battery pack, and/or lead to unexpected failures or other issues. FIG. 6 is a diagram illustrating an example correlation between an electric current measurement and a current factor used in the calculation of a warranty value according to an embodiment. Electric current may be directly measured for a battery pack, such as battery pack 100 of FIGS. 1A-C, and may provide charge and/or discharge rates of the battery pack.

Normal charge and discharge rates for batteries of different capacities may vary. For this reason, in an embodiment, electric current measurements may be normalized in order to apply a standard for determining normal charge and discharge rates for different battery packs. One of skill in the art will recognize that the measured electric current may be normalized based on the capacity of the battery pack, producing a C-rate. As an example, a normalized rate of discharge of 1C would deliver the battery pack's rated capacity in one hour, e.g., a 1,000 mAh battery would provide a discharge current of 1,000 mA for one hour. The C-rate may allow the same standard to be applied for determining normal charge and discharge, whether the battery pack is rated at 1,000 mAh or 100 Ah or any other rating known to one of ordinary skill in the art.

Still considering FIG. 6, example plot 602 illustrates current factor 606 as a function of a normalized C-rate 604, according to an embodiment. Electric current measurements may be used to calculate warranty values by converting the measured electric current to a corresponding current factor. In an embodiment, the measured electric current is first normalized to produce a C-rate. The C-rate indicates the charge or discharge rate of the battery pack and allows for consistent warranty calculations regardless of the capacity of the battery pack. The C-rate may then be mapped to current factors for use in warranty calculations. For example, a normalized C-rate of 1C may be mapped to a current factor of 2, whereas a C-rate of 3C may be mapped to a current factor of 10, indicating a higher rate of charge or discharge. In an embodiment, separate sets of mappings may be maintained for charge and discharge rates. In an embodiment, these mappings may be stored in a lookup table residing in a computer-readable storage device within the battery pack. In another embodiment, mappings and current factors may be stored in a computer-readable storage device that is external to the battery pack. Alternatively, in an embodiment, a predefined mathematical function may be applied to C-rates or electric current measurements to produce a corresponding current factor, rather than explicitly storing mappings and current factors.

In an embodiment, calculated C-rates above a maximum C-rate warranty threshold 608 may immediately void the warranty on the battery pack. This threshold may be pre-defined or set dynamically by the warranty tracker. In a non-limiting example, maximum warranty threshold 608 may be set to a C-rate of 2C. Calculated C-rates above maximum warranty threshold 608 may indicate improper usage of the battery pack, and hence the warranty may not cover subsequent issues that arise. In an embodiment, maximum warranty thresholds may be defined for both the rate of charge and discharge of the battery pack, rather than maintaining a single threshold for both charge and discharge.

Temperature is another factor that may affect battery performance. In general, higher temperatures may cause the battery pack to age at a faster rate by generating higher internal temperatures, which causes increased stress on the battery pack. This may shorten the life of a battery pack. On the other hand, lower temperatures may, for example, cause damage when the battery pack is charged.

Figure 7:
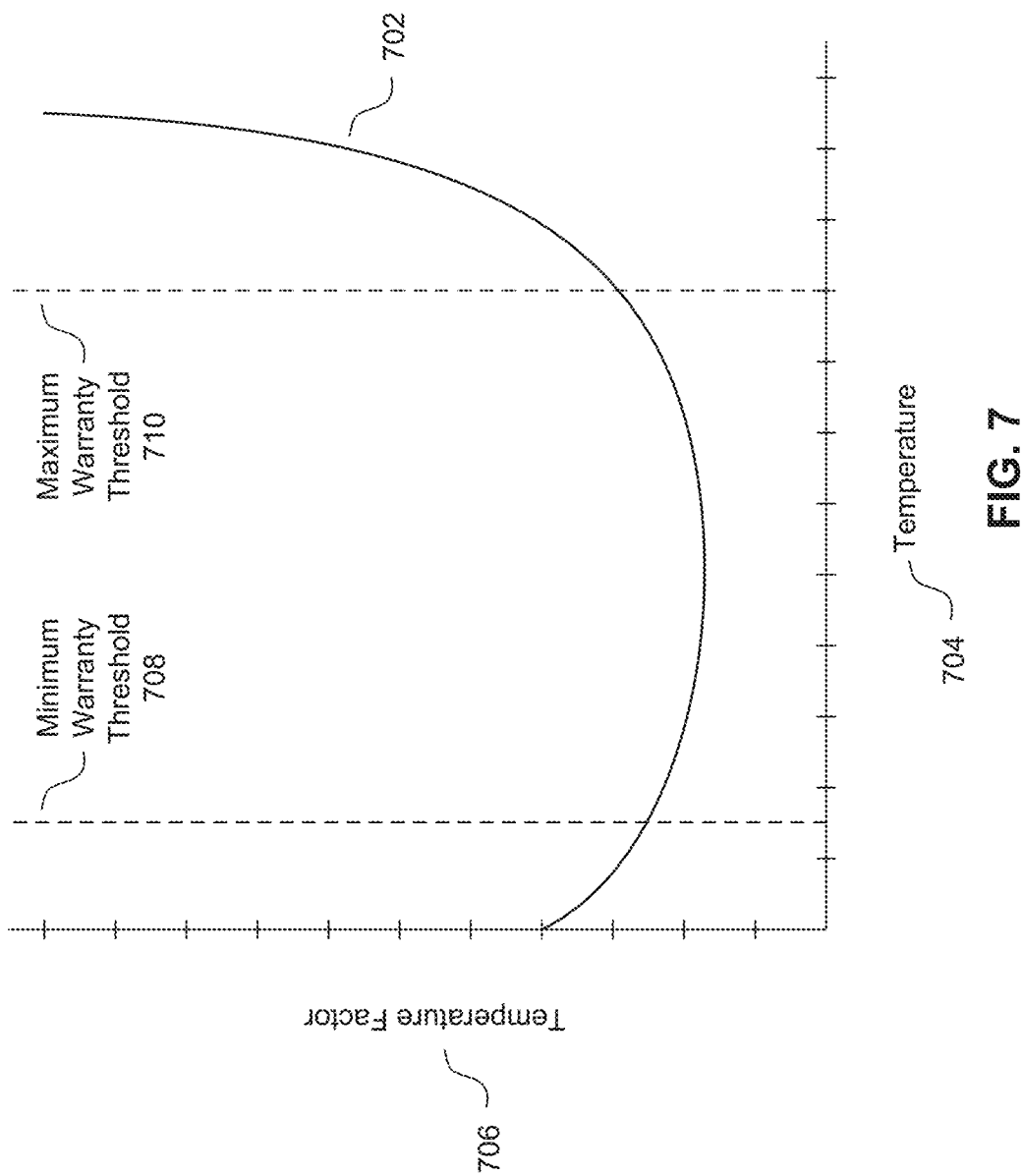
FIG. 7 is a diagram illustrating a correlation between a temperature measurement and a temperature factor used in the calculation of a warranty value, according to an embodiment.

FIG. 7 is a diagram illustrating an example correlation between a temperature measurement and a temperature factor used in the calculation of a warranty value according to an embodiment. A battery pack, such as battery pack 100 of FIGS. 1A-C, may include one or more battery temperature measurement circuits that measures the temperature of the individual battery cells or the individual battery modules within the battery pack. In another embodiment, the temperature measurement circuit may be external to the battery pack. Example plot 702 illustrates temperature factor 706 as a function of measured temperature 704, according to an embodiment. Temperature measurements may be used to calculate warranty values by converting the measured temperature to a corresponding temperature factor. In an embodiment, temperature measurements may be mapped to temperature factors for use in warranty calculations. For example, a normal operating temperature of 20° C. may be mapped to a temperature factor of 1, whereas a higher temperature of 40° C. would be mapped to a higher temperature factor. A higher temperature factor may indicate that battery wear is occurring at a faster rate. In an embodiment, these mappings may be stored in a lookup table residing in a computer-readable memory device within the battery pack. In another embodiment, mappings and temperature factors may be stored in a computer-readable memory device that is external to the battery pack. Alternatively, in an embodiment, a predefined mathematical function may be applied to temperature measurements to produce a corresponding temperature factor, rather than explicitly storing mappings and temperature factors.

Warranty thresholds may also be a function of battery temperature such as, for example, charging the battery pack when the temperature is below a predefined value. In an embodiment, operating temperatures below a minimum temperature warranty threshold 708 or above a maximum temperature warranty threshold 710 may immediately void the warranty on the battery pack. These thresholds may be predefined or set dynamically by the warranty tracker. Operating temperatures below minimum warranty threshold 708 or above maximum warranty threshold 710 may indicate improper usage of the battery pack, and hence the warranty may not cover subsequent operating issues or defects that arise. In an embodiment, minimum and maximum warranty thresholds may be defined for both charging and discharging the battery pack rather than maintaining the same thresholds for both charging and discharging.

Voltage and/or state-of-charge are additional factors that may affect battery performance. The voltage of a battery pack, which may be measured, may be used to calculate or otherwise determine the state-of-charge of the battery pack. In general, very high or very low states of charge or voltages cause increased stress on the battery pack. This, again, may shorten the life of the battery pack.

Figure 8:
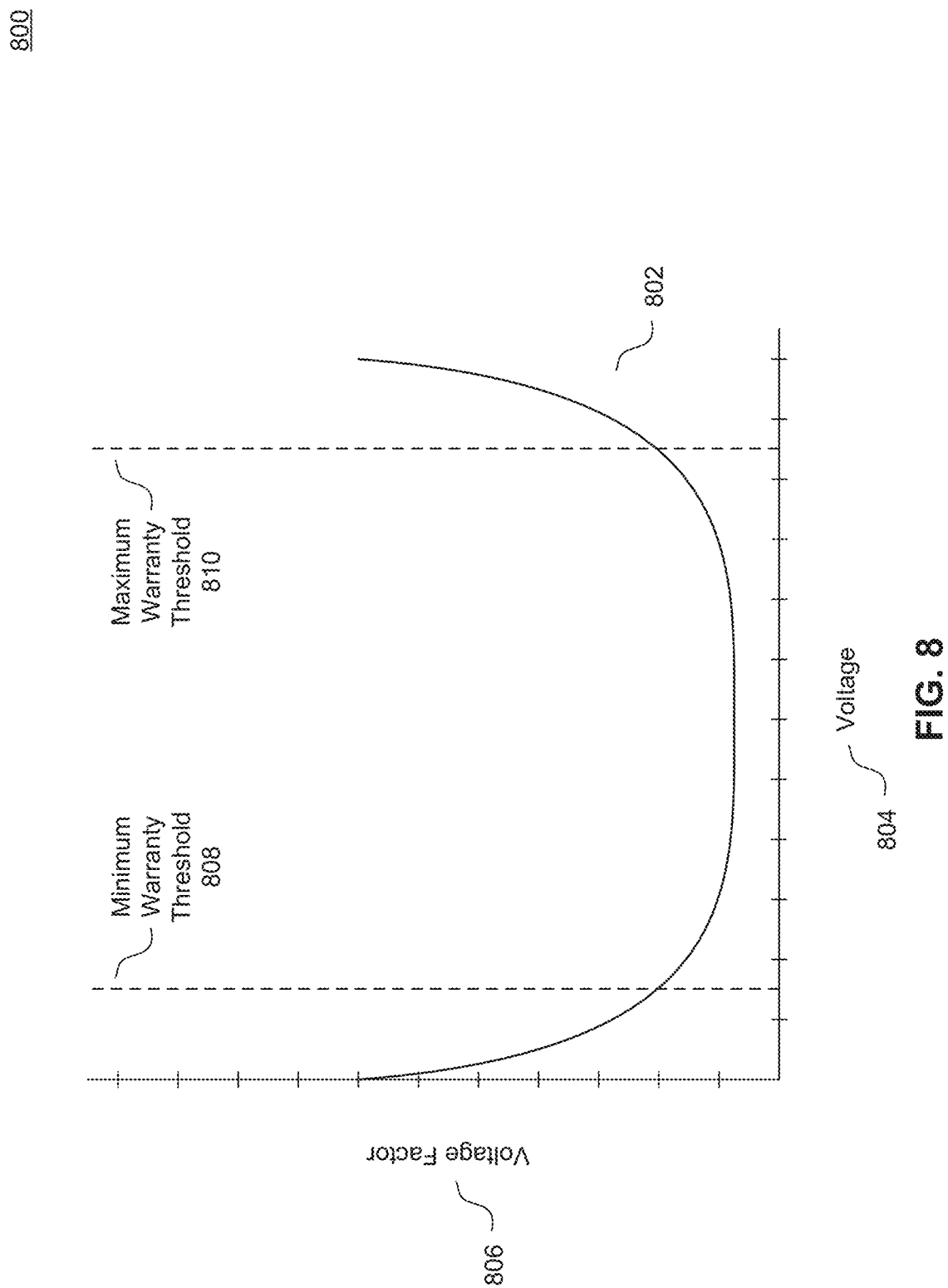
FIG. 8 is a diagram illustrating a correlation between a voltage measurement and a voltage factor used in the calculation of a warranty value, according to an embodiment.

FIG. 8 is a diagram illustrating an example correlation between a voltage measurement and a voltage factor used in the calculation of a warranty value according to an embodiment. A battery pack, such as battery pack 100 of FIGS. 1A-C, may include a battery voltage measurement circuit that measures the voltage of individual battery cells or the voltage of battery modules within the battery pack. In another embodiment, the voltage measurement circuit may be external to the battery pack. These voltage measurements may be aggregated or averaged for use in calculating warranty values for the battery pack. In an embodiment, the state-of-charge of the battery pack may be calculated and used in the calculation of a warranty value; however, this calculation is not always accurate and so care must be taken in determining a warranty calculation factor. In an embodiment, the measured voltage of the battery pack may be the average measured voltage of each battery cell or each battery module contained within the battery pack.

In FIG. 8, example plot 802 illustrates voltage factor 806 as a function of measured voltage 804, according to an embodiment. Voltage measurements may be used to calculate warranty values by converting the measured voltage to a corresponding voltage factor. In an embodiment, voltage measurements may be mapped to voltage factors for use in warranty calculations. These mappings may be specific to the type of battery cells contained in the battery pack. For example, a battery pack including one or more lithium-ion battery cells may have a nominal open-circuit voltage of 3.2V for each cell. In this case, a voltage measurement of 3.2V may be mapped to a voltage factor of 1. In contrast, a voltage measurement of 3.6V or 2.8V at a certain charge or discharge rate may be mapped to a higher voltage factor, indicating a higher or lower state-of-charge. In an embodiment, these mappings may be stored in a lookup table residing in a computer-readable memory device within the battery pack. In another embodiment, mappings and voltage factors may be stored in a computer-readable memory device external to the battery pack. Alternatively, in an embodiment, a predefined mathematical function may be applied to voltage measurements to produce a corresponding voltage factor, rather than explicitly storing mappings and voltage factors.

In an embodiment, measured voltages below a minimum voltage warranty threshold 808 or above a maximum voltage warranty threshold 810 may immediately void the warranty on the battery pack. These thresholds may be predefined or set dynamically by the warranty tracker. In a non-limiting example, minimum and maximum warranty thresholds 808 and 810 may be set to voltages indicating the over-discharging and over-charging of the battery cells, respectively. Measured voltages below minimum warranty threshold 808 or above maximum warranty threshold 810 may indicate improper usage of the battery pack, and hence the warranty may not cover subsequent issues that arise.

Figure 9:
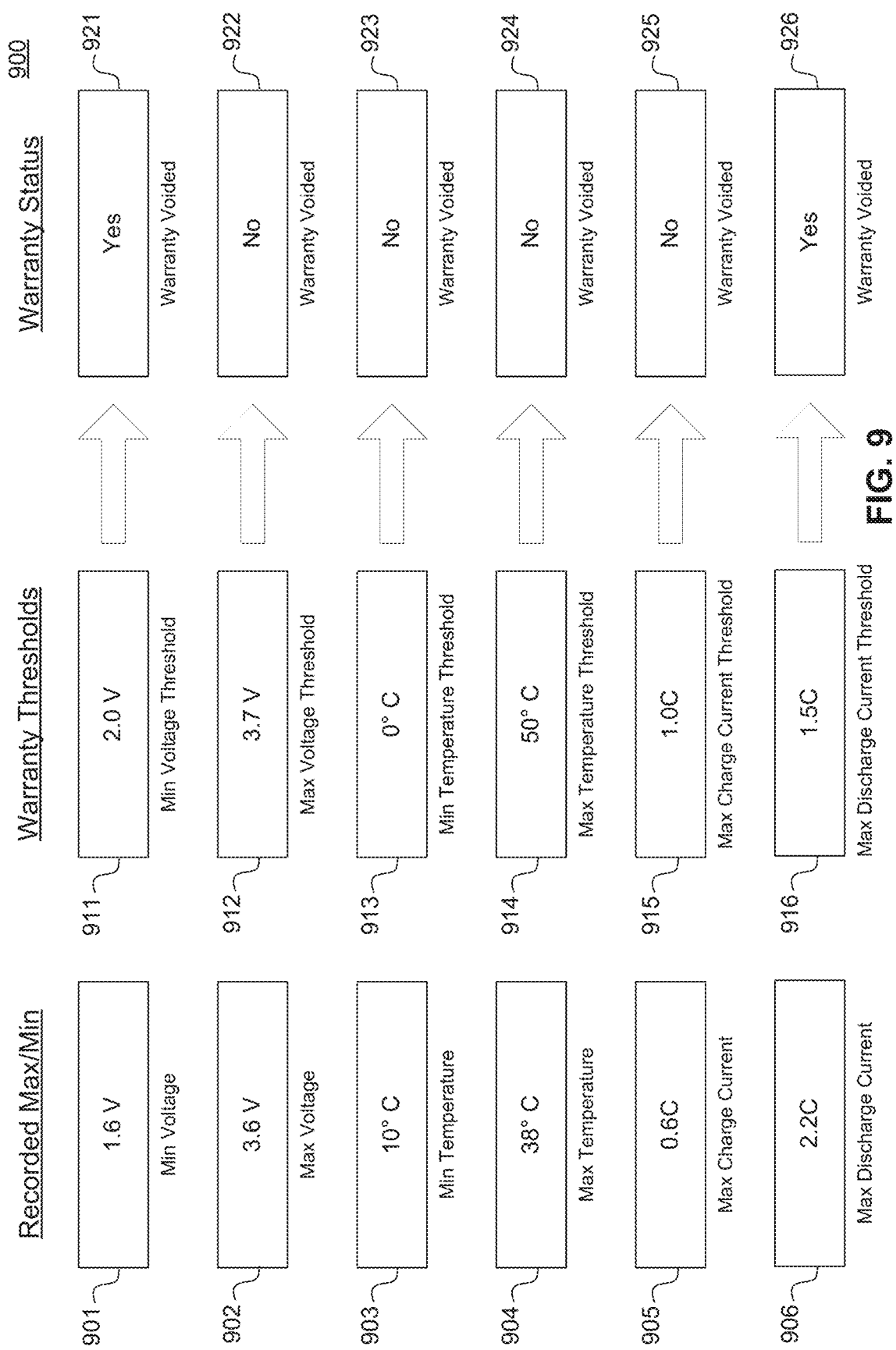
FIG. 9 is a diagram illustrating warranty thresholds used for voiding a warranty for a battery pack, according to an embodiment.

FIG. 9 is a diagram illustrating example warranty thresholds used for voiding a warranty for a battery pack according to an embodiment. As previously described, improper usage of a battery pack may cause a warranty to be automatically voided. For example, extreme operating temperatures, voltages, or charge/discharge rates may immediately void a warranty.

In various embodiments, a battery pack may store the minimum recorded voltage 901, maximum recorded voltage 902, minimum recorded temperature 903, maximum recorded temperature 904, maximum recorded charging electric current 905, and maximum recorded discharging electric current 906 for the life of the battery pack. These values may be recorded by any device or combination of devices capable of measuring or calculating the aforementioned data, such as (but not limited to) one or more battery voltage measurement circuit(s), battery temperature measurement circuit(s), and electric current measurement circuit(s), respectively, which are further described with respect to FIGS. 6-8. In an alternate embodiment, the battery pack may store in a computer-readable memory device a maximum recorded electric current, rather than both a maximum charging and discharging electric current. In an embodiment, data measurements may be recorded in a computer-readable memory device periodically during the life of the battery. For minimum values 901 and 903, if a newly recorded value is less than the stored minimum value, the previously stored minimum value is overwritten with the newly recorded value. For maximum values 902, 904, 905, and 906, if a newly recorded value is greater than the stored maximum value, the previously stored maximum value is overwritten with the newly recorded value.

In an embodiment, each battery pack may maintain a list of warranty threshold values, for example warranty threshold values 911-916, in a computer-readable storage device. In another embodiment, the list of warranty threshold values may be maintained in a computer-readable storage device that is external to the battery pack. Warranty threshold values may indicate minimum and maximum limits used to determine uses of the battery pack that are outside the warranty coverage. The warranty tracker may periodically compare the stored minimum and maximum values 901-906 to warranty threshold values 911-916 to determine whether a warranty for the battery pack should be voided.

In an embodiment, the battery pack may store a warranty status in a computer-readable storage device. The warranty status may be any type of data capable of representing a status. For example, the warranty status may be a binary flag that indicates whether the warranty has been voided. The warranty status may also be, for example, an enumerated type having a set of possible values, such as but not limited to, active, expired, and void.

As illustrated in FIG. 9, the warranty status is set based on a comparison of the recorded maximum and minimum values 901-906 to predefined warranty thresholds 911-916. For example, minimum recorded voltage 901 is 1.6 V and minimum voltage threshold 911 is 2.0 V. In this example, minimum recorded voltage 901 is less than minimum voltage threshold 911, and therefore the warranty is voided, as indicated at box 921. This will be reflected in the warranty status and stored. In various embodiments, when the warranty is voided, an electronic communication may be generated and sent by the battery pack and/or system in which the battery pack is used to notify selected individuals that the warranty has been voided. The electronic communication may also include details regarding the conditions or use that caused the warranty to be voided.

Figure 10:
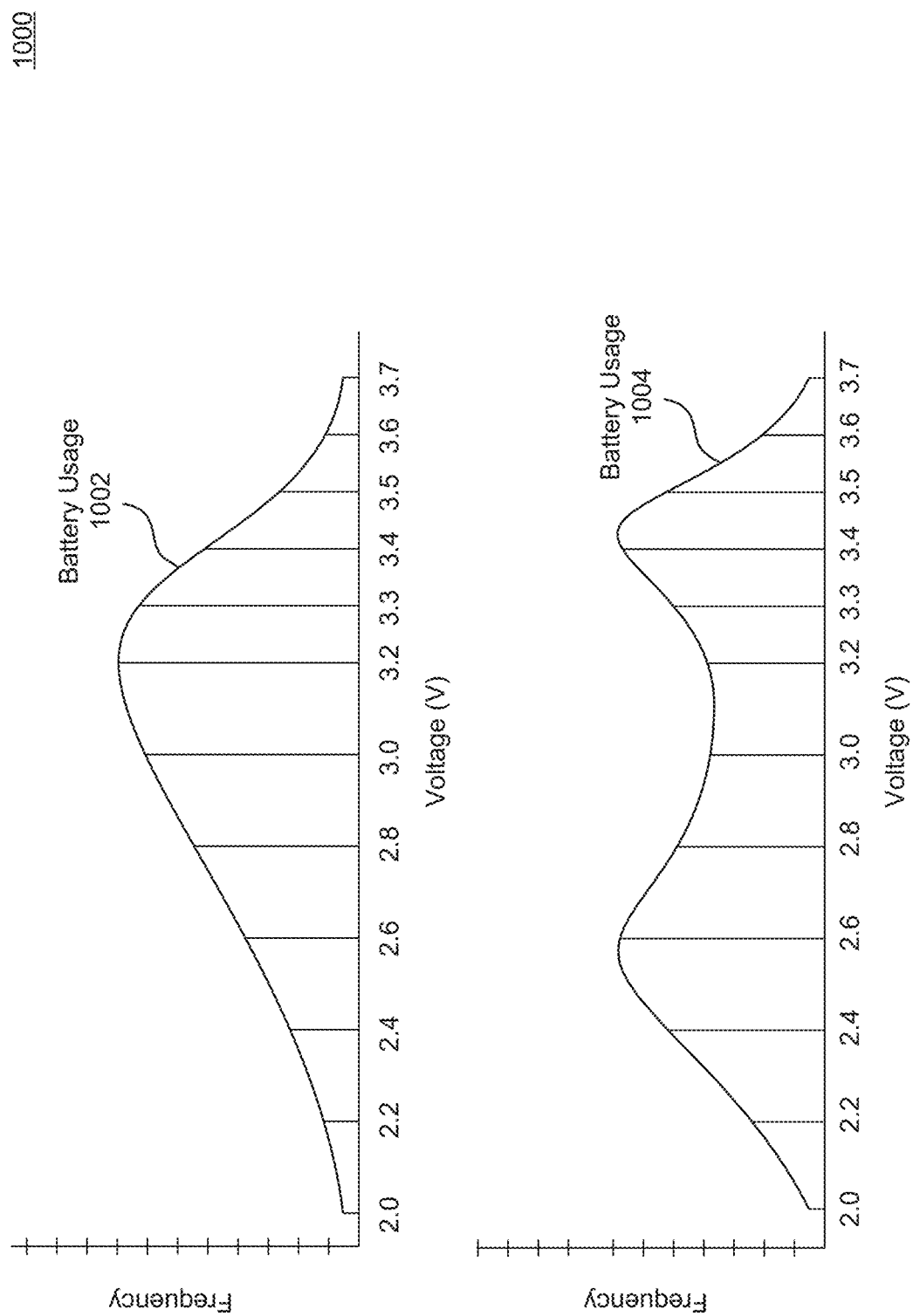
FIG. 10 is a diagram illustrating example usage of a battery pack, according to an embodiment.

FIG. 10 is a diagram illustrating example usage of a battery pack according to an embodiment. In addition to minimum and maximum data values being recorded, as described with respect to FIG. 9, usage frequency statistics may also be collected. For example, usage statistics may be recorded based on battery voltage measurements, battery temperature measurements, and charge/discharge current measurements.

In an embodiment, one or more ranges of values may be defined for each type of recorded data. In the example illustrated in FIG. 10, defined ranges for measured voltage are 2.0 V-2.2 V, 2.2 V-2.4 V, 2.4 V-2.6 V, 2.6 V-2.8 V, 2.8 V-3.0 V, 3.0 V-3.2 V, 3.2 V-3.3 V, 3.3 V-3.4 V, 3.4 V-3.5 V, 3.5 V to 3.6 V, and 3.6 V-3.7 V. These ranges may be common for lithium-ion batteries, for example, in order to capture typical voltages associated with such batteries. Each defined range may be associated with a counter. In an embodiment, each counter is stored in a computer-readable storage device within a battery pack. In other embodiments, counters may be stored external to a battery pack, for example in a string controller or a system controller of an electrical storage unit, as described with respect to FIG. 5. This may allow for further aggregation of usage statistics across multiple battery packs.

In an embodiment, voltage measurements may be taken periodically. When a measured value falls within a defined range, the associated counter may be incremented. The value of each counter then represents the frequency of measurements falling within the associated range of values. Frequency statistics may then be used to create a histogram displaying the distribution of usage measurements for the life of a battery pack, or during a period of time. Likewise, frequency statistics may be recorded for other measured or calculated data, such as but not limited to, battery temperature measurements and charge/discharge current measurements.

For example, battery usage 1002 represents the distribution of voltage measurements taken during the life of a battery pack. Battery usage 1002 may indicate ordinary or proper usage of a battery pack, having the highest frequency of measurements between 3.0 V and 3.2 V. In contrast, battery usage 1004 may indicate more unfavorable usage.

Histograms, such as those displayed in FIG. 10, may be useful to a manufacturer or seller in determining the extent of improper or uncovered usage of a battery pack. In an embodiment, the distribution data may also be used for analysis and diagnosis of battery pack defects and warranty claims.

Figure 11:
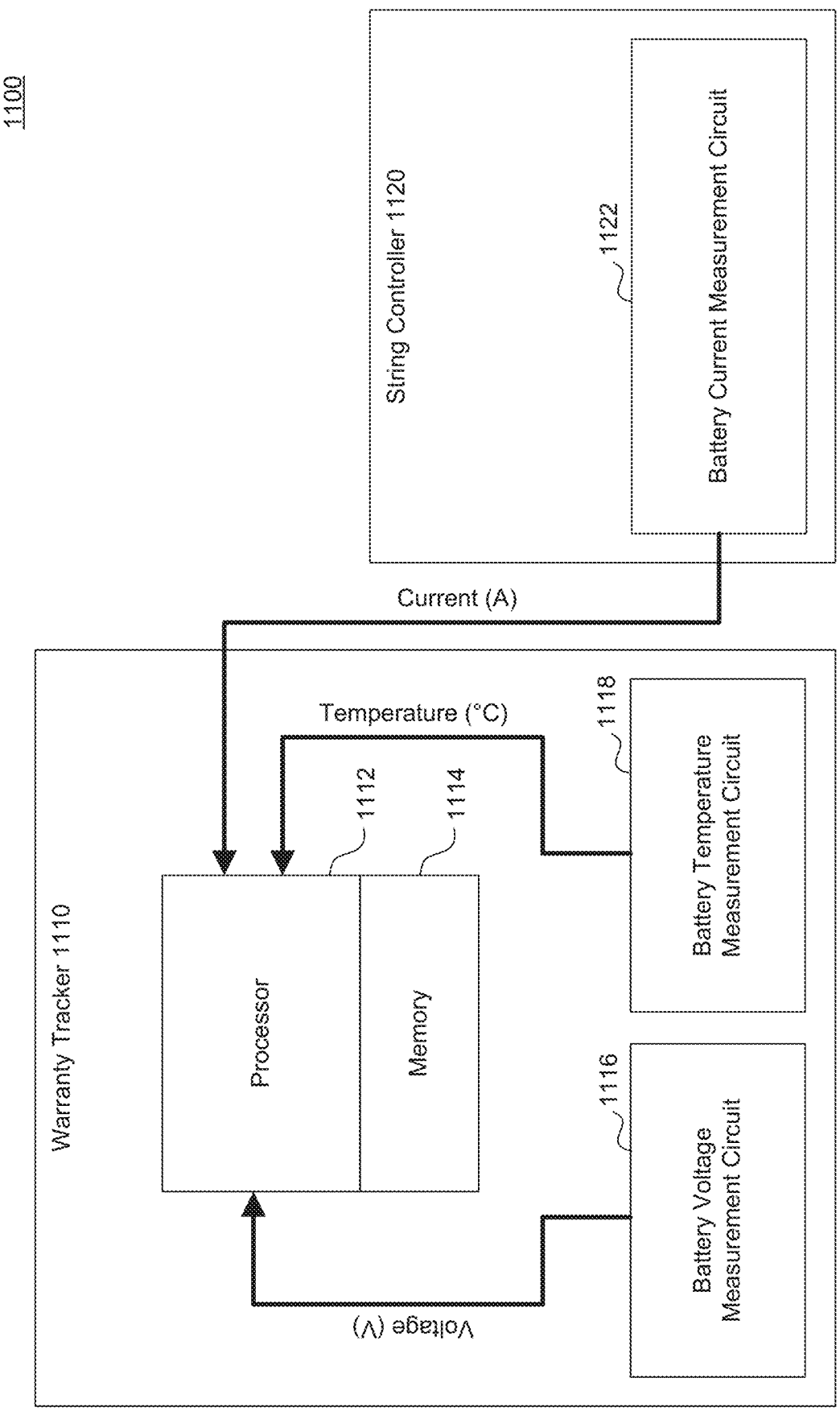
FIG. 11 is a diagram illustrating an example warranty tracker according to an embodiment.

FIG. 11 is a diagram illustrating an example warranty tracker according to an embodiment. Warranty tracker 1110 includes a processor 1112, a memory 1114, a battery voltage measurement circuit 1116, and a battery temperature measurement circuit 1118. The battery voltage measurement circuit 1116 and the battery temperature measurement circuit 1118 may be implemented as a single circuit or as separate circuits disposed on a printed circuit board. In some embodiments, such as those detailed above with respect to FIGS. 2 and 4, each battery module disposed in a battery pack may be coupled to a battery module controller that includes a battery voltage measurement circuitry as well as battery temperature measurement circuitry. In these embodiments, the processor 1112 and memory 1114 of example warranty tracker 1110 may be part of or implemented within a battery pack controller, such as battery pack controller 300 of FIG. 3. Thus, warranty tracker 1110 may be part of or implemented within a distributed battery management system, such as described with respect to FIG. 5.

In various embodiments, voltage may be measured as an aggregate voltage or average voltage of the battery cells or battery modules contained within the battery pack. Battery temperature measurement circuit 1118 may include one or more temperature sensors to periodically measure battery cell temperatures or battery module temperatures within the battery pack and send an aggregate or average temperature measurement to processor 1112.

In an embodiment, processor 1112 also receives periodic electric current measurements from battery current measurement circuit 1122. Battery current measurement circuit 1122 may be external to warranty tracker 1110. For example, battery current measurement circuit 1122 may reside with string controller 1120. String controller 1120 may be part of an electrical storage unit, as described with respect to FIG. 5, and may control a subset of battery packs. In another embodiment, battery current measurement circuit 1122 may be part of warranty tracker 1110.

Processor 1112 may compute warranty values based on received voltage, temperature, and electric current measurements. In an embodiment, each warranty value represents battery usage at the time the received measurements were recorded. Once received, measurements may be converted to associated factors for use in calculating a warranty value. For example, a voltage measurement received from battery voltage measurement circuit 1116 may be converted to a corresponding voltage factor as described with respect to FIG. 8. Similarly, received temperature measurements and electric current measurements may be converted to corresponding temperature and current factors as described with respect to FIGS. 6 and 7.

In an embodiment, processor 1112 may calculate a warranty value by multiplying the voltage factor, temperature factor, and current factor together. For example, the current factor may be 0 when a battery pack is neither charging nor discharging. The calculated warranty value will therefore also be 0, indicating that no usage is occurring. In another example, when battery temperature and voltage are at optimal levels, the corresponding temperature and voltage factors may be 1. The calculated warranty value will then be equal to the current factor corresponding to the measured electric current. When all factors are greater than zero, the warranty value indicates battery usage based on each of the voltage, temperature, and electric current measurements.

As described previously, additional measured or calculated data may also be used in the calculation of a warranty value. A warranty value may also be calculated based on any combination voltage, temperature, and current factors, according to an embodiment.

While a warranty value represents battery usage at a point in time, a warranty for a battery pack is based on battery usage for the life of the battery pack (which may be defined by the manufacturer of the battery pack). In an embodiment, memory 1114 stores a cumulative warranty value that represents battery usage over the life of the battery pack. Each time a warranty value is calculated, processor 1112 may add the warranty value to the cumulative warranty value stored in memory 1114. The cumulative warranty value may then be used to determine whether the battery pack warranty is active or expired.

Figure 12:
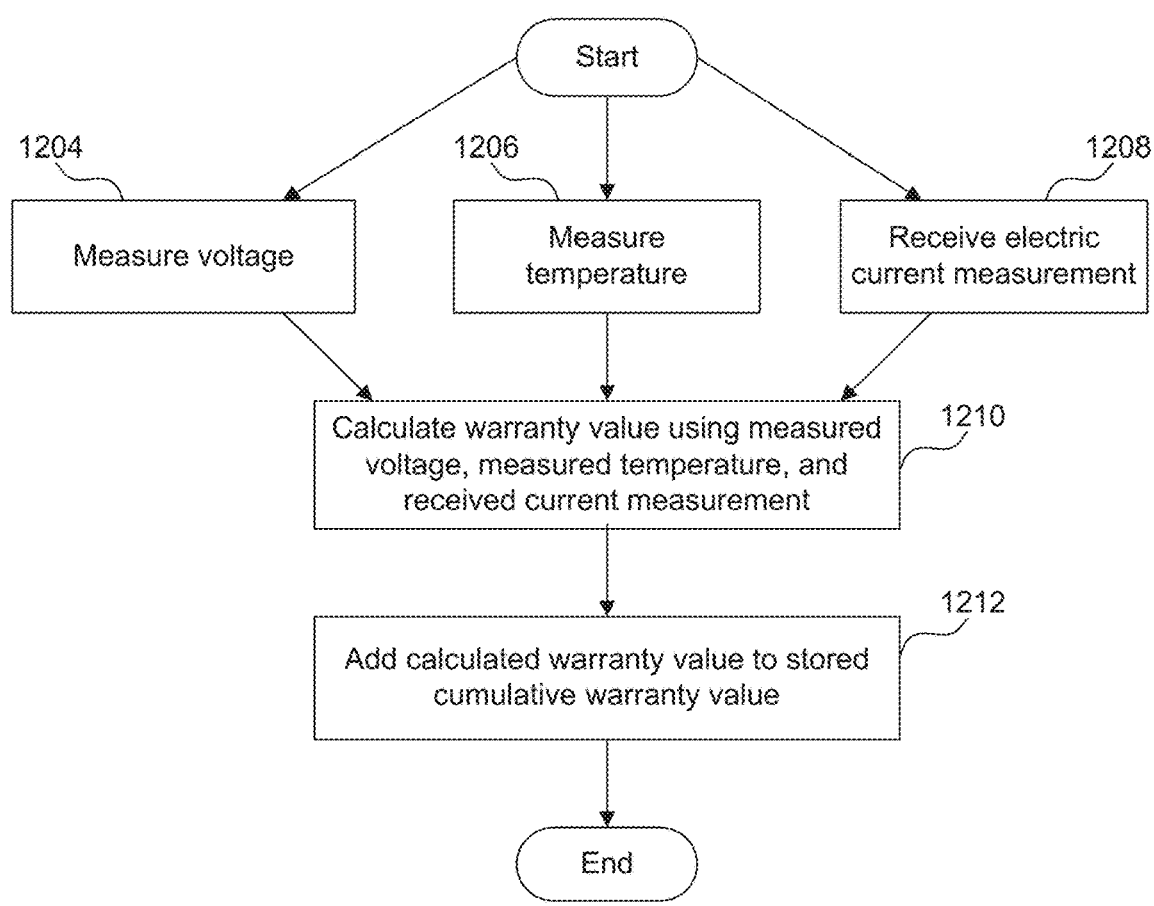
FIG. 12 is an example method for calculating and storing a cumulative warranty value, according to an embodiment.

FIG. 12 is an example method for calculating and storing a cumulative warranty value according to an embodiment. Each stage of the example method may represent a computer-readable instruction stored on a non-transitory computer-readable storage device, which when executed by a processor causes the processor to perform one or more operations.

Method 1200 begins at stage 1204 by measuring battery cell voltages within a battery pack. In an embodiment, battery cell voltage measurements for different battery cells or battery modules may be aggregated or averaged across a battery pack. At stage 1206, battery cell temperatures may be measured. In an embodiment, battery cell temperature measurements for different battery cells or battery modules may be aggregated or averaged across a battery pack. At stage 1208, an electric charge/discharge current measurement may be received. Stages 1204, 1206, and 1208 may be performed concurrently or in any order.

At stage 1210, a warranty value is calculated using the measured battery voltage, measured battery temperature, and received electric current measurement. In an embodiment, each warranty value represents battery usage at the time the measurements were recorded. Once received, measurements may be converted to associated factors for use in calculating a warranty value. For example, a voltage measurement may be converted to a corresponding voltage factor as described with respect to FIG. 8. Similarly, temperature measurements and received electric current measurements may be converted to corresponding temperature and current factors as described with respect to FIGS. 6 and 7.

In an embodiment, a warranty value may be calculated by multiplying the voltage factor, temperature factor, and current factor together. For example, the current factor may be 0 when a battery pack is neither charging nor discharging. The calculated warranty value will therefore also be 0, indicating that no usage is occurring. In another example, when battery temperature and voltage are at optimal levels, the corresponding temperature and voltage factors may be 1. The calculated warranty value will then be equal to the current factor corresponding to the measured electric current. When all factors are greater than zero, the warranty value indicates battery usage based on each of the voltage, temperature, and electric current measurements.

As described previously, additional measured or calculated data may also be used in the calculation of a warranty value. A warranty value may also be calculated based on any combination voltage, temperature, and current factors, according to an embodiment.

At stage 1212, the calculated warranty value is added to a stored cumulative warranty value. In an embodiment the cumulative warranty value may be stored within the battery pack. In other embodiments, the cumulative warranty value may be stored external to the battery pack. The cumulative warranty value may then be used to determine whether the battery pack warranty is active or expired, as will be discussed further with respect to FIGS. 13 and 14.

Figure 13:
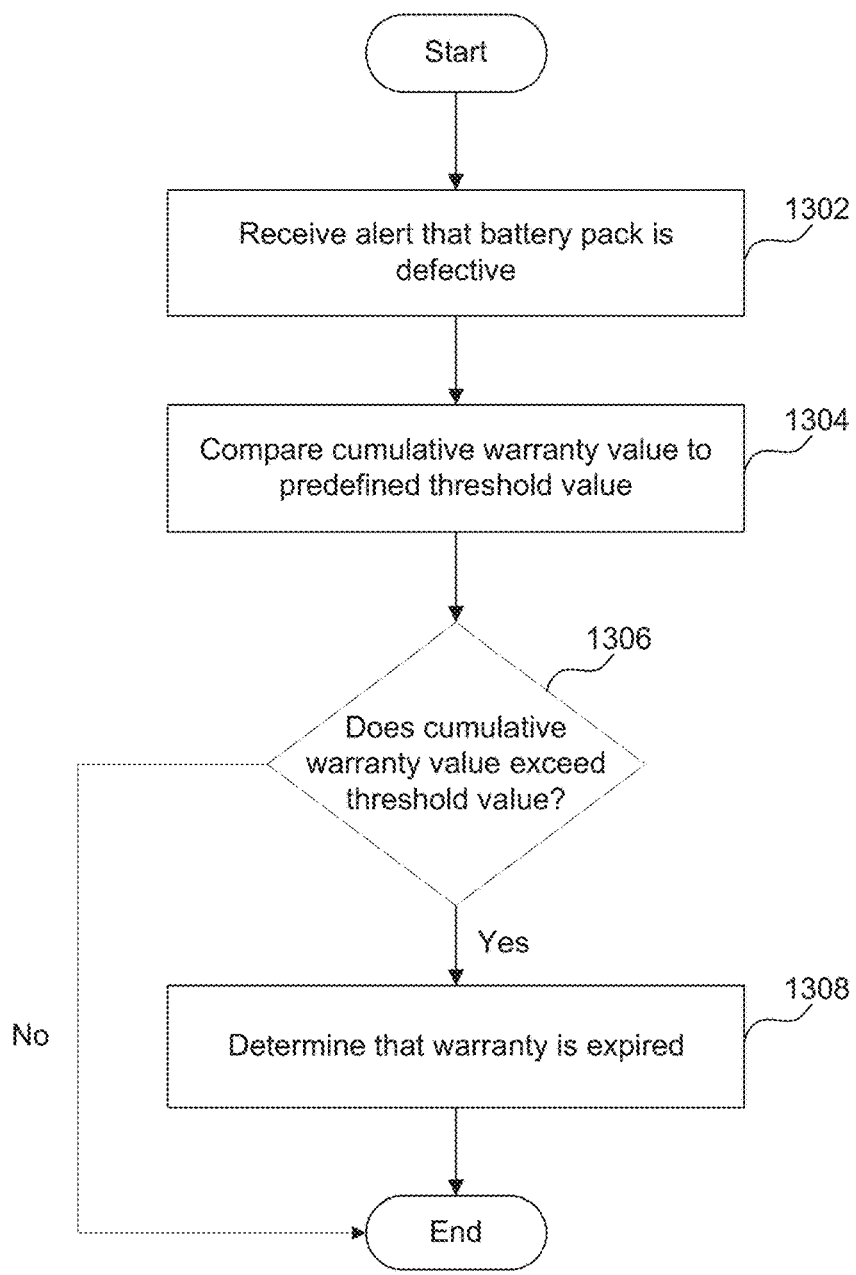
FIG. 13 is an example method for using a warranty tracker, according to an embodiment.

FIG. 13 is an example method for using a warranty tracker according to an embodiment. Each stage of the example method may represent a computer-readable instruction stored on a non-transitory computer-readable storage device, which when executed by a processor causes the processor to perform one or more operations. FIG. 13 begins at stage 1302 when a warning or alert is received indicating that a battery pack has an operating issue or is otherwise defective. In an embodiment, the alert may be issued as an email or other electronic communication to an operator responsible for monitoring the battery pack. In other embodiments, warnings or alerts may be audial or visual alerts, for example, a flashing red light on the defective battery pack, such as the warnings described above with respect to status button 108 of FIGS. 1A and 1B.

At stage 1304, the cumulative warranty value stored in the defective battery pack is compared to a predefined threshold value. This threshold value may be set to provide a certain warranty period based on normal usage of the battery pack. For example, the threshold may be set such that a battery pack may be covered under warranty for 10 years based on normal usage. In this manner, aggressive usage of the battery pack may reduce the active warranty period for the battery pack.

At stage 1306, it is determined whether the stored cumulative warranty value exceeds the predefined threshold value. If the stored cumulative value exceeds the predefined threshold value, method 1300 proceeds to stage 1308. At stage 1308, the warranty for the battery pack is determined to be expired. If the stored cumulative value does not exceed the threshold value, the method ends, indicating that the battery pack warranty has not expired.

Figure 14:
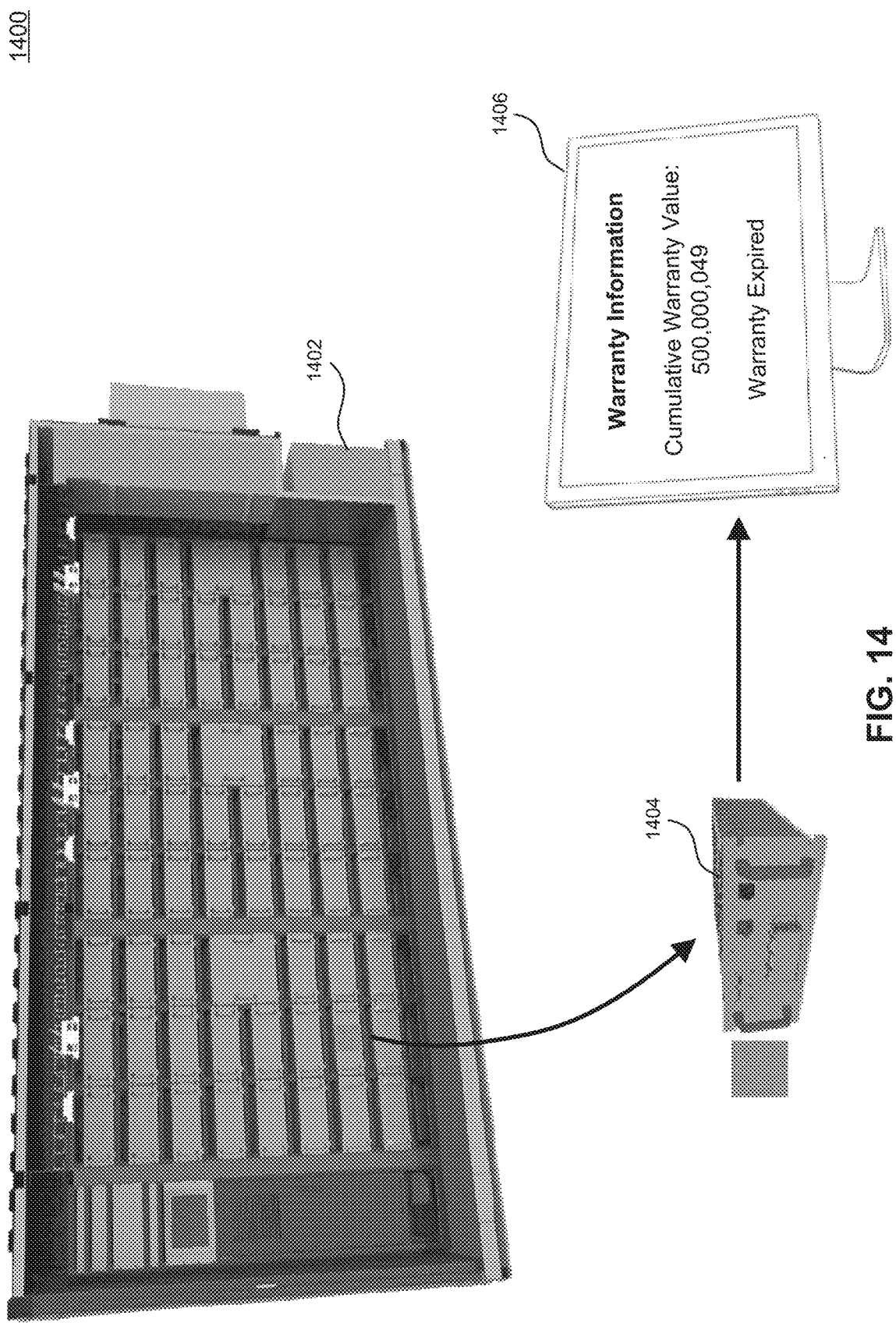
FIG. 14 is a diagram illustrating a defective battery pack and associated warranty information, according to an embodiment.

FIG. 14 is a diagram illustrating an example battery pack and associated warranty information according to an embodiment. When a battery pack is reported to be defective, analysis of warranty information may be conducted. As illustrated in FIG. 14, battery pack 1404 resides in an electrical storage unit 1402, similar to that of electrical storage unit 500 of FIG. 5. In response to an alert that battery pack 1404 is defective, battery pack 1404 may be removed from electrical storage unit 1402 for analysis.

In an embodiment, battery pack 1404 may be connected to a computing device with display 1406. In this manner, the battery pack operator, seller, or manufacturer may be able to view various warranty information and status in order to determine which party is financially responsible for repairing battery pack 1404. In the example illustrated in FIG. 14, a warranty threshold value may be set to 500,000,000, and the cumulative warranty value of the battery pack is 500,000,049. Because the cumulative warranty value exceeds the warranty threshold, the battery pack warranty is determined to be expired, and the battery pack operator or owner should be financially responsible for repairs.

In an embodiment, warranty information for battery pack 1404 may be viewed without physically removing battery pack 1404 from electrical storage unit 1402. For example, stored warranty information may be sent via accessible networks to a device or data center external to battery pack 1404 for analysis, such as described below in FIGS. 15-16.

Figure 15:
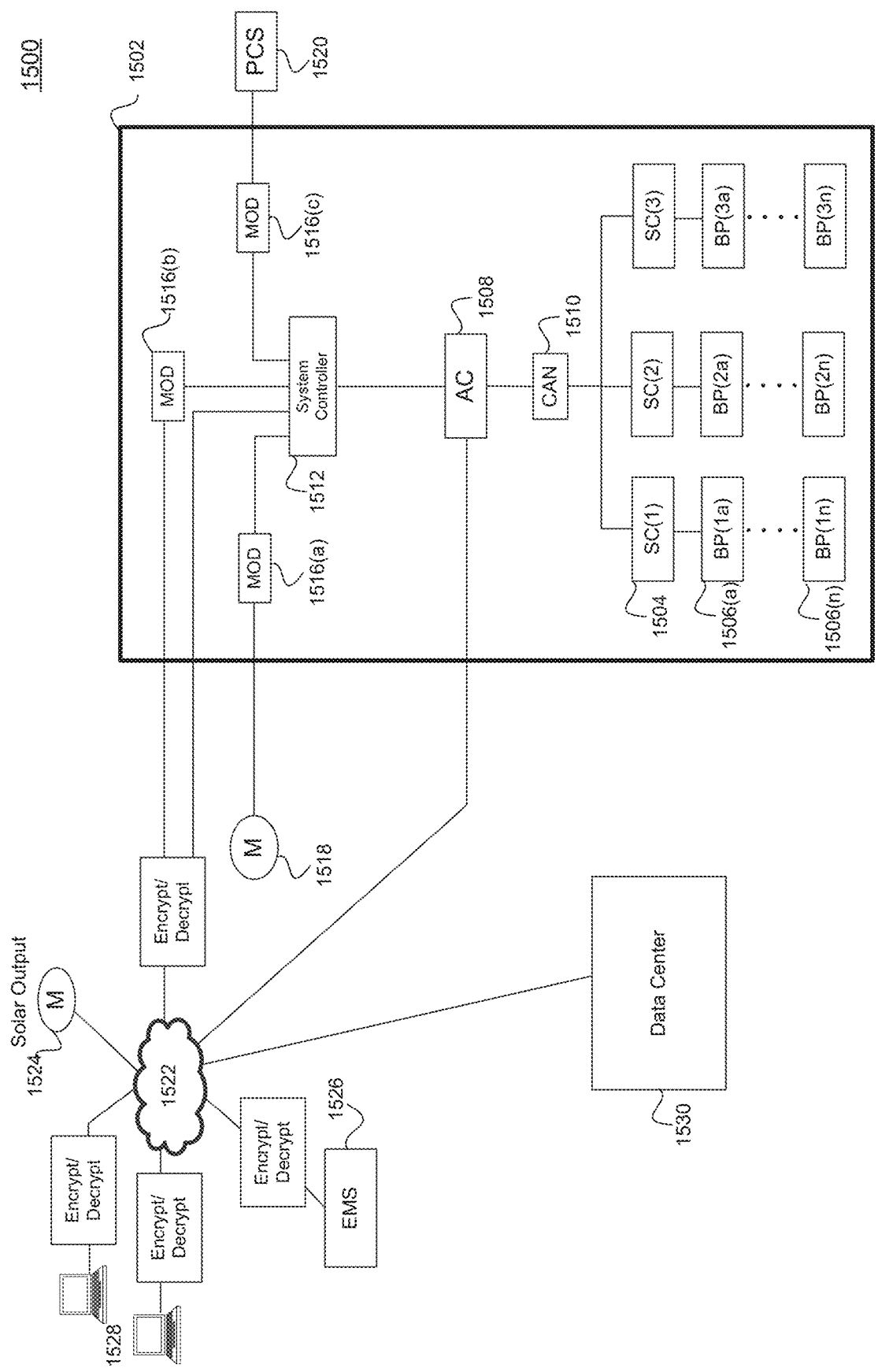
FIG. 15 is a diagram illustrating an example battery energy storage system (BESS) coupled to an example energy management system, according to an embodiment.

FIG. 15 is a block diagram illustrating an example battery energy storage system (BESS) 1502 according to an embodiment. BESS 1502 may be coupled to energy management system (EMS) 1526 via communication network 1522. Communication network 1522 may be any type of communication network, including (but not limited to) the Internet, a cellular telephone network, etc. Other devices coupled to communication network 1522, such as computers 1528, may also communicate with BESS 1502. For example, computers 1528 may be disposed at the manufacturer of BESS 1502 to maintain (monitor, run diagnostic tests, etc.) BESS 1502. In other embodiments, computers 1528 may represent mobile devices of field technicians that perform maintenance on BESS 1502. As shown in FIG. 15, communications to and from BESS 1502 may be encrypted to enhance security.

Field monitoring device 1524 may also be coupled to EMS 1526 via communication network 1522. Field monitoring device 1524 may be coupled to an alternative energy source (e.g., a solar plant, a wind plant, etc.) to measure the energy generated by the alternative energy source. Likewise, monitoring device 1518 may be coupled to BESS 1502 and measure the energy generated by BESS 1502. While two monitoring devices are illustrated in FIG. 15, a person of skill in the art would recognize that additional monitoring devices that measure the energy generated by energy sources (conventional and/or alternative energy sources) may be connected to communication network 1522 in a similar manner. A human operator and/or a computerized system at EMS 1526 can analyze and monitor the output of the monitoring devices connected to communication network 1522, and remotely control the operation of BESS 1502. For example, EMS 1526 may instruct BESS 1502 to charge (draw energy from power grid via PCS 1520) or discharge (provide energy to power grid via PCS 1520) as needed (e.g., to meet demand, stabilize line frequency, etc.).

BESS 1502 includes a hierarchy of control levels for controlling BESS 1502. The control levels of BESS 1502, starting with the top level are system controller, array controller, string controller, battery pack controller, and battery module controller. For example, system controller 1512 may be coupled to one or more array controllers (e.g., array controller 1508), each of which may be coupled to one or more string controllers (e.g., string controller 1504), each of which may be coupled to one or more battery pack controllers, each of which may be coupled to one or more battery module controllers. Battery pack controllers and battery modules controllers are disposed with battery packs 1506(a)-1506(n), as was discussed in detail with respect to FIGS. 26-29 above.

As shown in FIG. 15, system controller 1512 is coupled to monitoring device 1518 via communication link 1516(a), to communication network 1522 via communication link 1516(b), and to PCS 1520 via communication link 1516(c). In FIG. 15, communication links 1516(a)-(c) are MOD busses, but any wired and wireless communication link may be used. In an embodiment, system controller 1512 is also connected to communication network 1522, for example by a TCP/IP connection or other wired or wireless link.

System controller 1512 can monitor and report the operation of BESS 1502 to EMS 1526 or any other device connected to communication network 1522 and configured to communicate with BESS 1502. System controller 1512 can also receive and process instructions from EMS 1526, and relay instructions to an appropriate array controller (e.g., array controller 1508) for execution. System controller 1512 may also communicate with PCS 1520, which may be coupled to the power grid, to control the charging and discharging of BESS 1502. Although system controller 1512 is shown disposed within BESS 1502 in FIG. 15, system controller 1512 may be disposed outside of and communicatively coupled to BESS 1502 in other embodiments.

In an embodiment, system controller 1512 is coupled to array controller 1508 via a communication link. For example, this communication link may be a TCP/IP link or other wired or wireless communication link. Array controller 1508 is coupled to one or more string controllers, such as string controller 1504 via communication link 1510. While FIG. 15 depicts three string controllers (SC(1)-(3)) more or less string controllers may be coupled to array controller 1508. In FIG. 15, communication link 1510 is depicted as CAN bus, but other wired or wireless communication links may be used.

Each string controller in BESS 1502 is coupled to one or more battery packs. For example, string controller 1504 is coupled to battery packs 1506(a)-(n), which are connected in series to form a battery pack string. Any number of battery packs may be connected together to form a battery pack string. Strings of battery packs can be connected in parallel in BESS 1502. Two or more battery pack strings connected in parallel may be referred to as an array of battery packs or a battery pack array. In one embodiment, BESS 1502 includes an array of battery packs having six battery pack strings connected in parallel, where each of the battery pack strings has 22 battery packs connected in series.

As its name suggests, a string controller may monitor and control the battery packs in the battery pack string. The functions performed by a string controller may include, but are not limited to, the following: issuing battery string contactor control commands, measuring battery string voltage; measuring battery string current; calculating battery string Amp-hour count; relaying queries between a system controller (e.g., at charging station) and battery pack controllers; processing query response messages; aggregating battery string data; performing software device ID assignment to the battery packs; detecting ground fault current in the battery string; and detect alarm and warning conditions and taking appropriate corrective actions. Example embodiments of a string controller are described below with respect to FIGS. 30, 31A, and 31B.

Likewise, an array controller may monitor and control a battery pack array. The functions performed by an array controller may include, but are not limited to, the following: sending status queries to battery pack strings, receiving and processing query responses from battery pack strings, performing battery pack string contactor control, broadcasting battery pack array data to the system controller, processing alarm messages to determine necessary actions, responding to manual commands or queries from a command line interface (e.g., at an EMS), allowing a technician to set or change the configuration settings using the command line interface, running test scripts composed of the same commands and queries understood by the command line interpreter, and broadcasting data generated by test scripts to a data server for collection.

Additionally, in an embodiment, array controller 1508 may be coupled to a data center 1530 via network 1522. As discussed above, battery packs 1506(a)-(n) may measure battery attributes such as battery cell voltage, cell temperature, and electric current using various sensors within or attached to each battery pack. Array controller 1506 may monitor and receive measurements from battery packs 1506(*a*)-(*n*) periodically, for example every 30 seconds. Each battery pack 1506(*a*)-1506(*n*) may also compute a warranty value at each interval, as discussed above with respect to FIGS. 6-9. These computed warranty values may be sent to array controller 1508 for tracking and/or analysis. In an embodiment, array controller 1508 may further send the data received from battery packs 1506(*a*)-(*n*) to system controller 1512 for tracking and/or analysis.

In an embodiment, array controller 1508 includes a network interface for establishing a data connection to network 1522. Array controller 1508 may then periodically transmit measurement data received from battery packs 1506(*a*)-(*n*) and computed warranty values to data center 1530 via network 1522 for further analysis. In an embodiment, system controller 1512 may also include a network interface for establishing a data connection to network 1522, and system controller 1512 may alternatively transmit the measurement data received from battery packs 1506(*a*)-(*n*) and computed warranty values to data center 1530. As described above, each battery pack 1506(*a*)-(*n*) may have an associated warranty that warrants the performance of the battery pack. Data center 1530 may function to analyze and enforce these warranties, as will be described in further detail with respect to FIG. 16.

Figure 16:
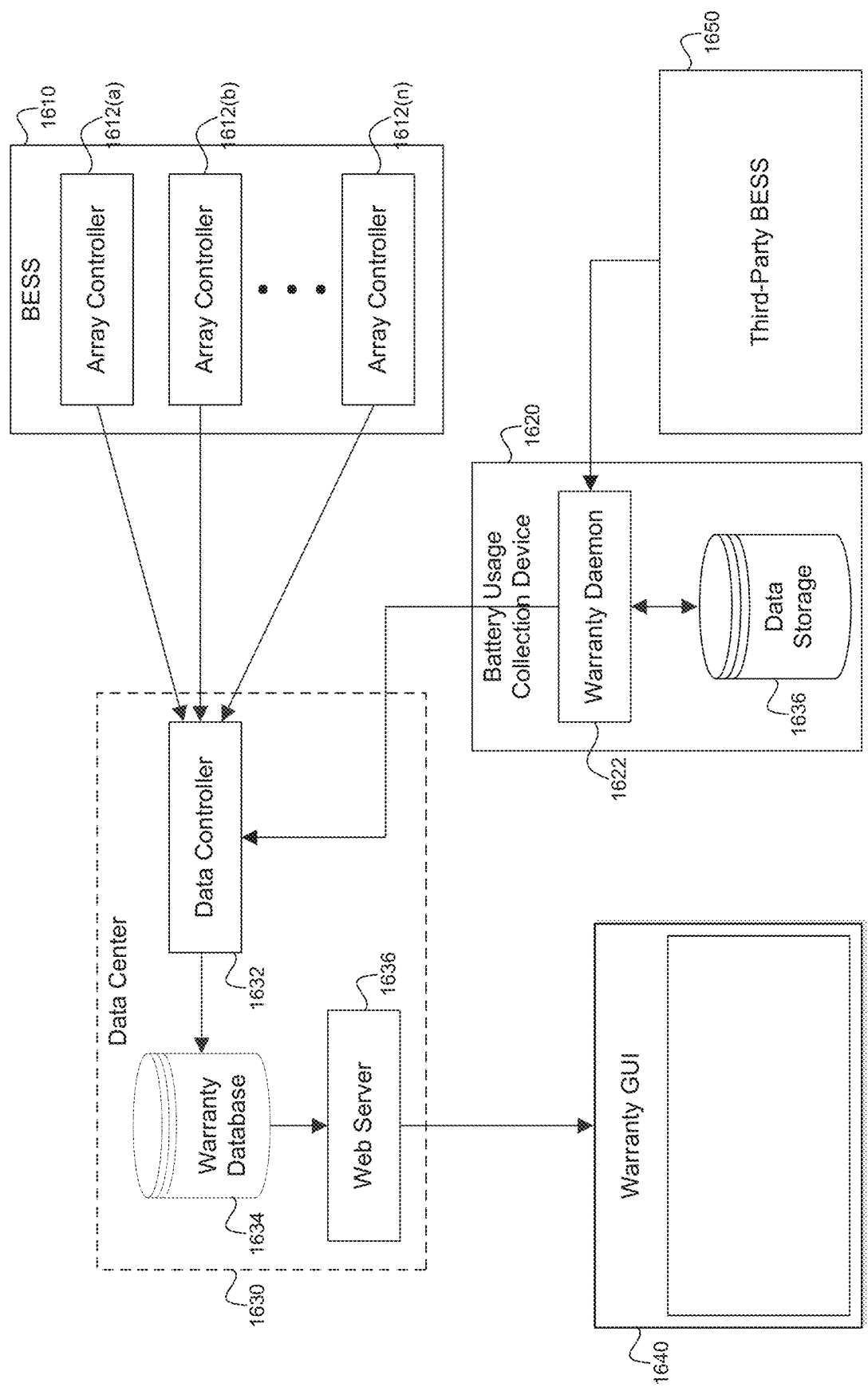
FIG. 16 is a block diagram illustrating an example system for monitoring battery usage data for battery packs maintained within a battery energy management system (BESS), according to an embodiment.

FIG. 16 is a block diagram illustrating an example system for monitoring battery usage data for battery packs maintained within a battery energy storage system (BESS), according to an embodiment. As discussed above, BESS 1610 may include a plurality of battery packs that arranged into strings and arrays. BESS 1610 may be coupled to a data center 1630 and may periodically receive collected battery usage data from BESS 1610. In an embodiment, array controllers 1612(*a*)-(*n*) (each controlling an array of battery packs within BESS 1610) may periodically transmit battery usage data to data center 1630 for storage and analysis. Alternatively, a system controller within BESS 1610 may receive battery usage data from array controllers 1612(*a*)-(*n*) and transmit the data to data center 1630. In an embodiment, the battery usage data may include battery cell voltage measurements, cell temperature measurements, electric current measurements, computed warranty values, or any other calculated usage value or usage statistic. These measurements are discussed in detail above with respect to FIGS. 6-9. In an embodiment, battery usage data may also include battery identification information, such as but not limited to, a battery serial number, a date and/or time of data collection, manufacturer and model information, and project, location, or other BESS identification information.

In an embodiment, data center 1630 may include a data controller 1632, a warranty database 1634, and a web server 1636. In an alternative embodiment, web server 1636 may be located external to data center 1630 and coupled to the data center via a data network, such as network 1522 of FIG. 15. Data controller 1632 and warranty database 1634 may reside on the same of different computing devices, for example computing device 1700 of FIG. 17.

In an embodiment, warranty database 1634 may store battery usage data for a plurality of battery packs, such as those contained in BESS 1610 and third-party BESS 1650. Each battery pack may be part of a project, and warranty database 1634 may be partitioned by project to simplify access permissions to data stored within the database. A project typically refers to a physical location where battery packs are deployed and maintained, for example, a BESS such as BESS 1610 or third-party BESS 1650. A project may also refer to a group of related battery energy storage systems, or any other logical grouping of deployed battery packs. In an embodiment, warranty database 1634 may be partitioned by creating logical divisions within a single database instance. Additionally or alternatively, warranty database 1634 may include multiple database instances each corresponding to a particular project.

In an embodiment, battery usage data transmitted by array controllers 1612(*a*)-(*n*) for battery packs within BESS 1610 may be received at data center 1630 by data controller 1632. Battery identification information contained within the battery usage data may then be examined to determine a project to which each battery pack belongs. The received battery usage data can then be analyzed by data controller 1632 for purposes of monitoring a warranty for each battery pack.

As described above, battery sensor measurements, such as voltage, temperature, and electric current measurements, can be used to compute a warranty value indicating overall battery usage for a given period of time. This computed warranty value may be added to a stored cumulative warranty value for the battery pack, representing the battery pack's lifetime overall usage. In an embodiment, a warranty on the battery pack may include a predefined warranty threshold. When data controller 1632 receives the cumulative warranty value for a battery pack, data controller 1632 may compare the received warranty value to the warranty threshold to determine whether a warranty exception has occurred. If the received warranty value exceeds the warranty threshold, a warranty exception has occurred and this status and detail may be stored in warranty database 1634. This exception may void the warranty on the battery pack and/or cause data controller 1632 to generate a notification, such as an email, to the owner/operator of the battery pack informing that an exception has occurred. In an embodiment, data controller 1632 may initially receive the computed warranty value for the battery pack over a given period of time, rather than the cumulative warranty value. In this case, data controller 1632 may add the warranty value to a stored cumulative warranty value (e.g., stored in warranty database 1634) prior to comparing the cumulative warranty value to the warranty threshold.

In an embodiment, the battery pack warranty may also include maximum and minimum thresholds for battery sensor measurements, such as voltage, temperature, and electric current thresholds. Warranty database 1634 may track the maximum and minimum battery sensor values for each battery pack. When battery usage data is received by data controller 1632, each received battery sensor measurement may be compared to the corresponding maximum and minimum thresholds defined by the warranty. If the measurement value is above the corresponding maximum threshold or below the minimum thresholds, data controller 1632 may determine that a warranty exception has occurred. This exception may void the battery pack warranty and/or cause data controller 1632 to generate a notification to the owner/operator of the battery pack informing that an exception has occurred. In this manner, data controller 1632 enables warranties to be placed on the performance of a battery pack by enabling a warranty provider to monitor not only the overall usage of a battery pack, but also the manner in which the battery pack was used.

In an embodiment, data controller 1632 may periodically generate a report including battery usage data store in the warranty database and an exception status for each battery pack. This report may be transmitted to a party servicing a battery pack warranty, for example a manufacturer of the battery pack or an insurance company. By partitioning warranty database 1632 by project, a party could choose to service a particular project, and reports may be be generated on a project basis and sent to the servicing party.

Warranty database 1634 may be any type of structured data store, such as a relational, document-oriented, or object-oriented database. In an embodiment, warranty database 1634 may maintain a normalized database schema in order to reduce data redundancy and memory storage requirements. Data controller 1632 may format received battery usage data according the data schema of warranty database 1634 before storing the data. Alternatively, the battery usage data may already conform to the data schema of warranty database 1634 upon receipt by data controller 1632.

In order to optimize the storage requirements of warranty database 1634, according to an embodiment, warranty database 1634 may employ fixed-size or variable-size counters to track received battery usage data. Each counter may correspond to a particular battery usage attribute, and further to a particular range of values. For example, as described with respect to FIG. 10, warranty database 1634 may include counters for ranges of battery cell voltage measurement values, such as 2.0 V-2.2 V, 2.2 V-2.4 V, etc. When a battery cell voltage measurement is received by data controller 1632, the data controller may correlate the measurement value to one of the predefined ranges of measurement values. The counter corresponding to the determined range may then be incremented without storing the received voltage measurement. In this manner, the storage required by warranty database 1632 does not increase as battery usage data for existing projects and battery packs are received (or may increase by a negligible amount in the case of variable-length counters). In an embodiment, data controller 1632 receives the battery usage data already in the form of fixed- or variable-size counter values, which may simply be added to the existing counter values in warranty database 1634.

Web server 1636 allows a user to access and view data stored in warranty database 1634. In an embodiment, web server 1636 may provide a graphical user interface (GUI) 1640 to users to monitor associated projects and battery packs. GUI 1640 may be displayed on a client computing device, such as computing device 1700 of FIG. 17, which may be coupled to web server 1636 via a data network, such as network 1522 of FIG. 15. An example GUI is described below in FIGS. 18-29. Various types of users may use GUI 1640 to view battery usage data, such as an owner or operator of a battery pack or a warranty/insurance provider for a battery pack. The monitoring provided by GUI 1640 allows identification of warranty violations and may avoid disputes by verifying battery usage and determining which parties are at fault.

Web server 1636 may service requests from users to access data stored in warranty database 1632. Upon receiving a request, web server 1636 may verify that the requested battery usage data is authorized to be access by the requesting user. In various embodiments, users may be granted access to data related to particular battery packs, storage systems, or projects. If web server 1636 determines that the user is authorized to access the requested data, the data is retrieved and provided to the user in the GUI.

As described previously, BESS 1610 includes array controllers and/or a system controller that may receive battery usage data from managed battery packs and transmit the data to data center 1630. However, third-party systems may not include this functionality, such as third-party BESS 1650 illustrated in FIG. 16. In this case, a battery usage collection device 1620 may be employed to gather battery usage data from third-party BESS 1650 and then transmit the data to data controller 1632 of data center 1630.

Figure 17:
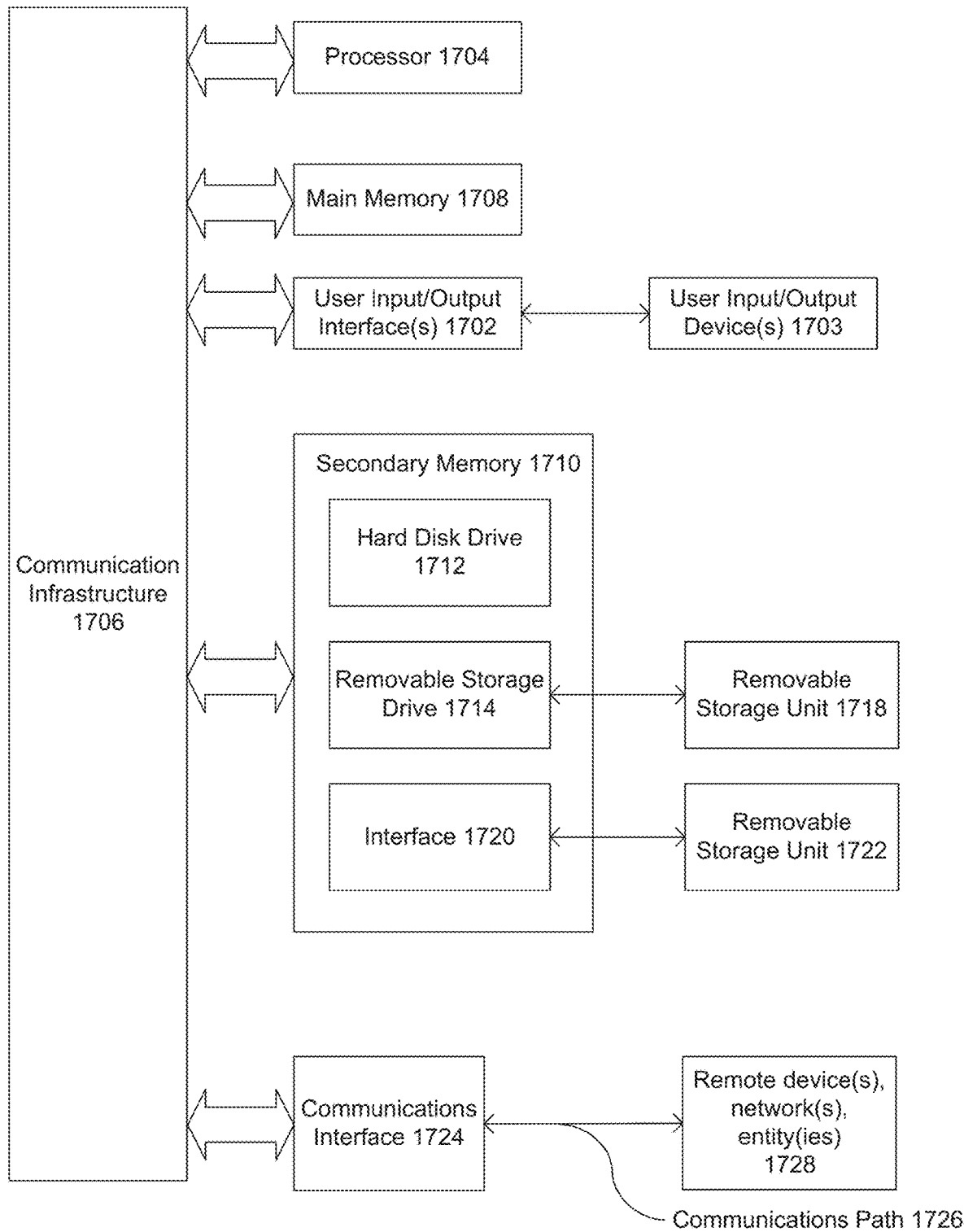
FIG. 17 is an example computing system useful for implementing various embodiments.

Battery usage collection device 1620 may be a computing device such as computing device 1700 of FIG. 17. This device may be used to retrofit existing battery energy storage systems to collect and transmit battery usage data to data center 1630. In an embodiment, battery usage collection device 1620 may be connected to third-party BESS 1650 via a hard-wired data connection. Alternatively, battery usage collection device 1620 and third-party BESS 1650 may be connected via a local area network (LAN).

Third-party BESS 1650 may include processes and battery pack sensors to collect, access, and/or output various battery usage statistics, such as battery cell voltage, temperature, or electric current. Battery usage collection device 1620 takes advantage of these processes to collect battery usage data and transmit the collected data to data center 1630. In an embodiment, battery usage collection device 1620 includes warranty daemon 1622 and data storage 1624. Warranty daemon 1622 may monitor third-party BESS 1650 for recorded battery usage data. This battery usage data may include battery identification information for and battery sensor measurements over a period of time for each battery pack contained within third-party BESS 1650, as described with respect to BESS 1610.

Because the core of third-party BESS 1650 may not be modified in most cases, warranty daemon 1622 handles calculations that may otherwise have been performed by BESS 1610. For example, once warranty daemon 1622 receives battery usage data from BESS 1650, warranty daemon 1622 may compute a warranty value for each batter back based on the battery usage data and included battery sensor measurements, as described above. In an embodiment, warranty daemon may store the received battery usage data and computed warranty value in data store 1624 and transmit this information to data center 1630 at a later time. For instance, warranty daemon 1622 may receive battery usage data once an hour, store this information in data store 1624, and transmit the stored data once a day to data center 1630. Alternatively, warranty daemon 1622 may stream battery usage data to data center 1630 as it is received from third-party BESS 1650.

In an embodiment, warranty daemon 1622 may perform similar functions as data controller 1632 to optimize storage and transmission requirements of received battery usage data. For example, warranty daemon 1622 may correlate received battery sensor measurement values to predefined ranges of measurement values for storage and transmission to data center 1630. In this case, data store 1624 may employ fixed-size or variable-size counters for each predefined range of values to track received battery sensor measurements. A counter may also be used to track and accumulate warranty values computed by warranty daemon 1622. Tracking these counter values at battery usage collection device 1620 may provide smaller size data transmissions to data center 1630 compared with transmitting raw, log-style recorded usage data. In an embodiment, warranty daemon 1622 may also normalize received battery usage data according to a predefined format, for example, data units and formats used by warranty database 1634.

In an embodiment, third-party BESS 1650 may periodically output recorded battery usage data for contained battery packs to a data file. In an embodiment, the data file may be a text file, but one of ordinary skill will appreciate that the battery usage data could be output to any type of readable data file. Warranty daemon 1622 may periodically monitor this file or a location containing this file for newly recorded data. When a change is detected, warranty daemon 1622 may open the data file and parse the file according to predefined rules to extract the new battery usage data. In various embodiments, the parsing rules may be defined manually as part of initialization of battery usage collection device 1620, or automatically based on analysis of the data file format. In an embodiment, third-party BESS 1650 may also provide an application programming interface (API) to access battery usage data. The battery usage data may be recorded to a database or other storage for access by the API, or the API may provide direct access to battery usage data in real-time or near real-time, such as streaming data as the data is measured or computed. In an embodiment, the API may enable battery usage measurements or statistics to be captured ad-hoc via an API request. In this manner, warranty daemon 1622 may use this API to retrieve new battery usage data. Thus, warranty daemon 1622 may be adapted to obtain battery usage data from a variety of existing battery energy storage systems having different architectures and capabilities.

FIG. 17 is an example computing system useful for implementing various embodiments. Various embodiments can be implemented, for example, using one or more well-known computer systems, such as computer system 1700. Computer system 1700 can be any well-known computer capable of performing the functions described herein, such as computers available from International Business Machines, Apple, Sun, HP, Dell, Sony, Toshiba, etc.

Computer system 1700 includes one or more processors (also called central processing units, or CPUs), such as a processor 1704. Processor 1704 may be connected to a communication infrastructure or bus 1706.

One or more processors 1704 may each be a graphics processing unit (GPU). In an embodiment, a GPU is a processor that is a specialized electronic circuit designed to rapidly process mathematically intensive applications on electronic devices. The GPU may have a highly parallel structure that is efficient for parallel processing of large blocks of data, such as mathematically intensive data common to computer graphics applications, images and videos.

Computer system 1700 also includes user input/output device(s) 1703, such as monitors, keyboards, pointing devices, etc., which communicate with communication infrastructure 1706 through user input/output interface(s) 1702.

Computer system 1700 also includes a main or primary memory 1708, such as random access memory (RAM). Main memory 1708 may include one or more levels of cache. Main memory 1708 may have stored therein control logic (i.e., computer software) and/or data.

Computer system 1700 may also include one or more secondary storage devices or memory 1710. Secondary memory 1710 may include, for example, a hard disk drive 1712 and/or a removable storage device or drive 1714. Removable storage drive 1714 may be a floppy disk drive, a magnetic tape drive, a compact disk drive, an optical storage device, tape backup device, and/or any other storage device/drive.

Removable storage drive 1714 may interact with a removable storage unit 1718. Removable storage unit 1718 includes a computer usable or readable storage device having stored thereon computer software (control logic) and/or data. Removable storage unit 1718 may be a floppy disk, magnetic tape, compact disk, DVD, optical storage disk, and/or any other computer data storage device. Removable storage drive 1714 reads from and/or writes to removable storage unit 1718 in a well-known manner.

According to an exemplary embodiment, secondary memory 1710 may include other means, instrumentalities, or other approaches for allowing computer programs and/or other instructions and/or data to be accessed by computer system 1700. Such means, instrumentalities, or other approaches may include, for example, a removable storage unit 1722 and an interface 1720. Examples of the removable storage unit 1722 and the interface 1720 may include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 1700 may further include a communication or network interface 1724. Communication interface 1724 enables computer system 1700 to communicate and interact with any combination of remote devices, remote networks, remote entities, etc. (individually and collectively referenced by reference number 1728). For example, communication interface 1724 may allow computer system 1700 to communicate with remote devices 1728 over communications path 1726, which may be wired and/or wireless, and which may include any combination of LANs, WANs, the Internet, etc. Control logic and/or data may be transmitted to and from computer system 1700 via communication path 1726.

In an embodiment, a tangible apparatus or article of manufacture comprising a tangible computer useable or readable medium having control logic (software) stored thereon is also referred to herein as a computer program product or program storage device. This includes, but is not limited to, computer system 1700, main memory 1708, secondary memory 1710, and removable storage units 1718 and 1722, as well as tangible articles of manufacture embodying any combination of the foregoing. Such control logic, when executed by one or more data processing devices (such as computer system 1700), causes such data processing devices to operate as described herein.

Figure 18:
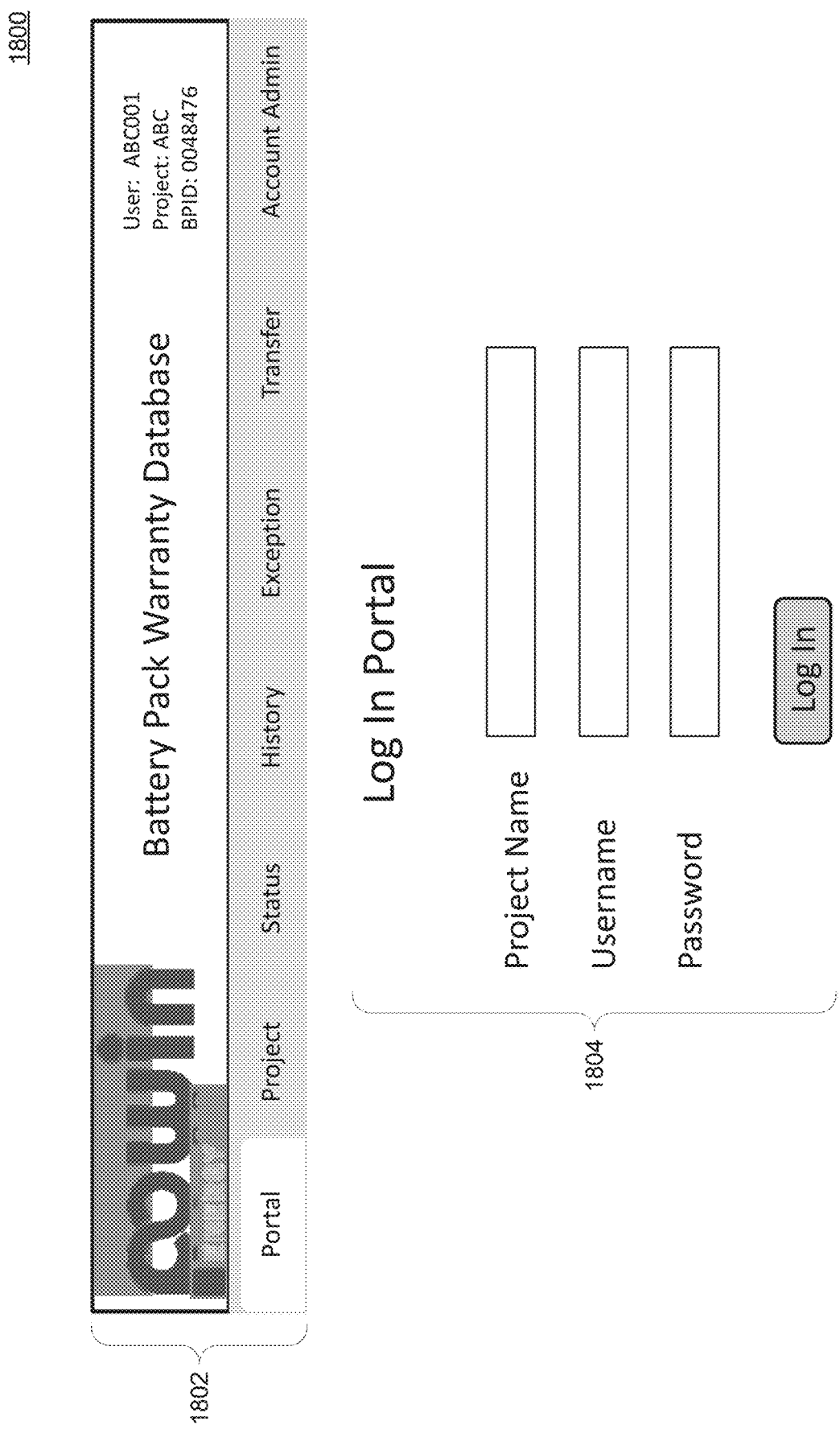
FIG. 18 is an example user interface for logging into a battery pack warranty application, according to an embodiment.

FIG. 18 is an example user interface 1800 for logging into a battery pack warranty application, according to an embodiment. User interface 1800 includes menu panel 1802 and login panel 1804. Login panel 1804 requires a user to enter a username and password, as well as a project they desire to access. In an embodiment, the user must be authorized to access the entered project in order for the login to be successful.

Figure 19:
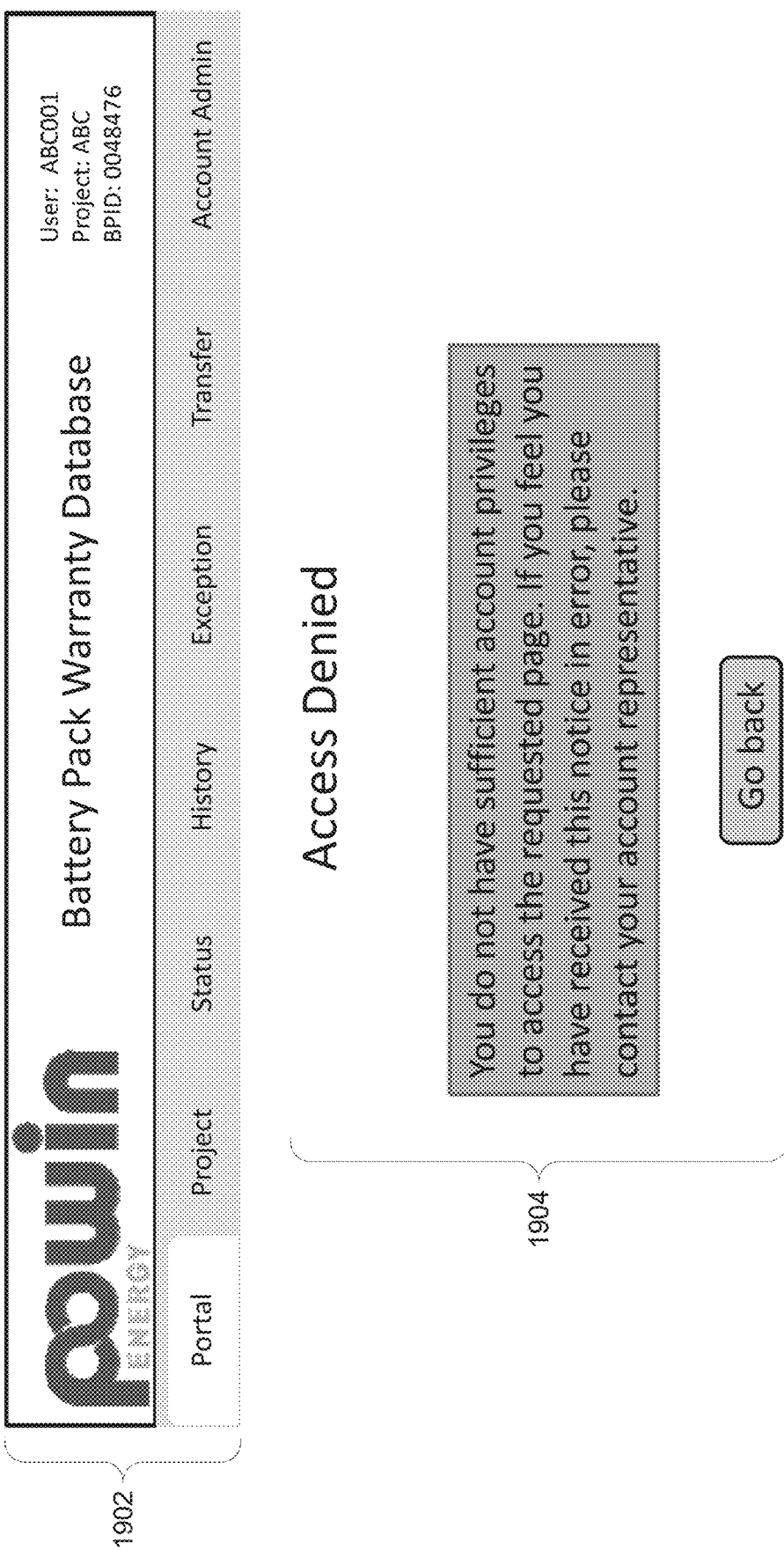
FIG. 19 is an example user interface illustrating an authentication failure, according to an embodiment.

FIG. 19 is an example user interface 1900 illustrating an authentication failure, according to an embodiment. User interface 1900 includes menu panel 1902 and alert panel 1904. In an embodiment, when a user attempts to access a portion of the user interface to which the user is not authorized, an "Access Denied" message may be displayed to the user.

Figure 20:
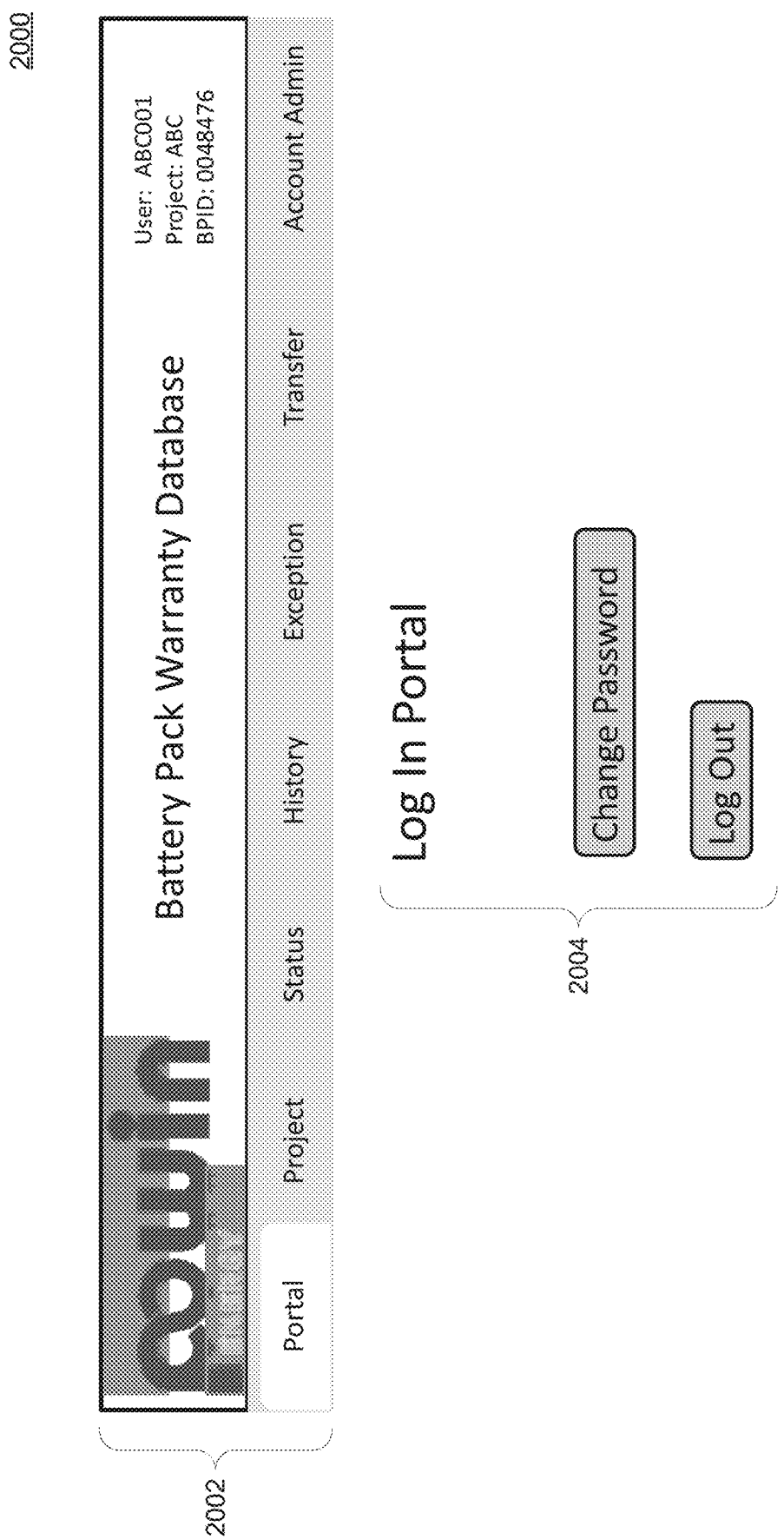
FIG. 20 is an example user interface for selecting to change a user password, according to an embodiment.

FIG. 20 is an example user interface 2000 for selecting to change a user password, according to an embodiment. User interface 2000 includes menu panel 2002 and landing panel 2004. In an embodiment, landing panel 2004 may appear after a user logs in and enable the user to quickly change his or her password.

FIG. 21 is an example user interface 2100 for changing a user password, according to an embodiment. User interface 2100 includes menu panel 2102 and password panel 2104. In an embodiment, password panel 2104 allows a user to change his or her password by clicking the "Submit Account Change" button.

Figure 22:
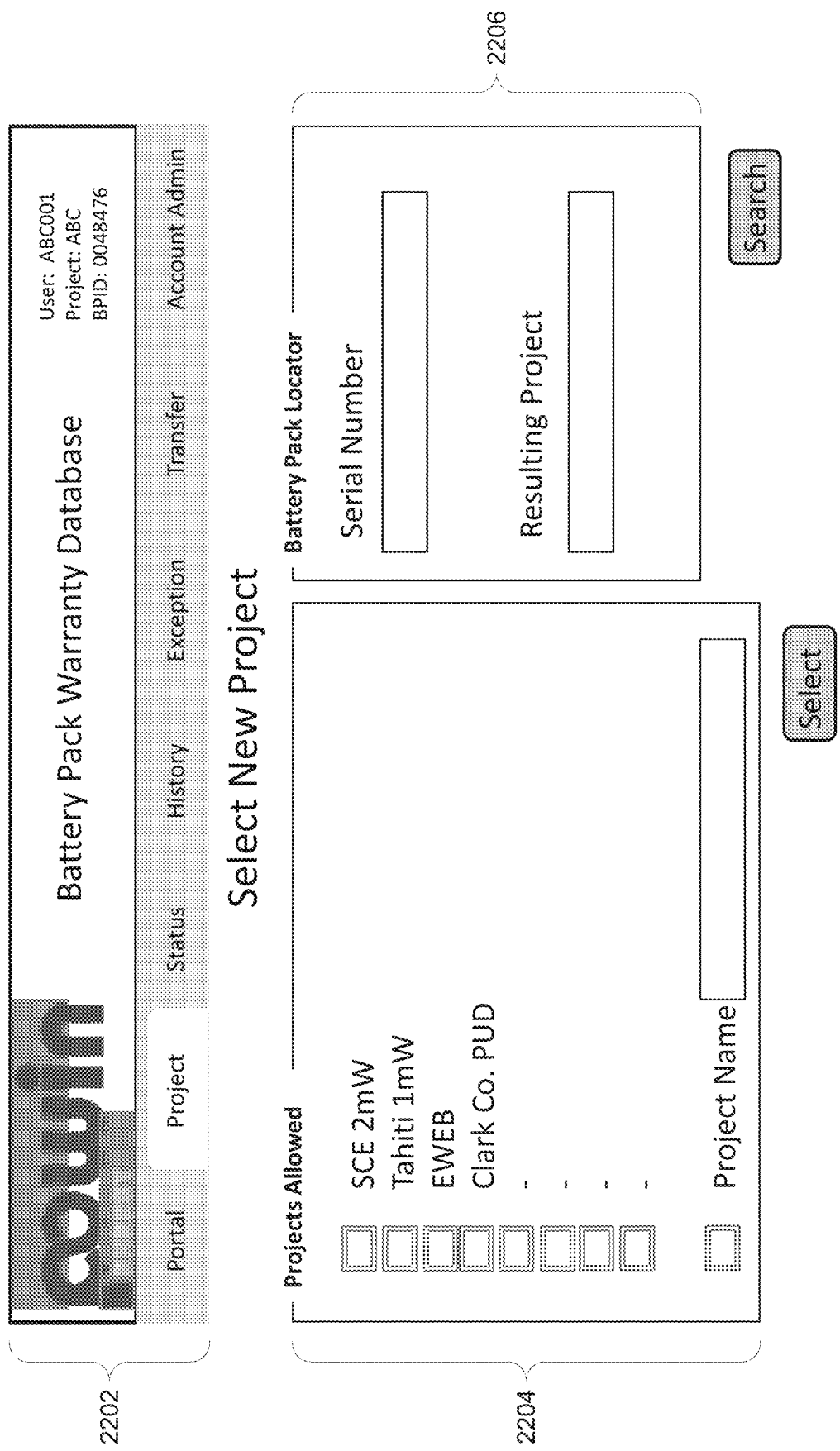
FIG. 22 is an example user interface for selecting a project to access, according to an embodiment.

FIG. 22 is an example user interface 2200 for selecting a project to access, according to an embodiment. User interface 2200 includes menu panel 2202, projects panel 2204, and locator panel 2206. In an embodiment, a user may select a project to view in projects panel 2204. Projects panel 2204 may only display projects that the user is authorized to access for convenience, but a user may search for another project in the "Project Name" text field. In an embodiment, a user may also find a project by searching for a specific battery pack in locator panel 2206.

Figure 23:
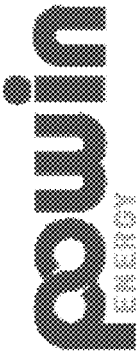
FIG. 23 is an example user interface for viewing battery pack status and usage data, according to an embodiment.

FIG. 23 is an example user interface 2300 for viewing battery pack status and usage data, according to an embodiment. User interface 2300 includes menu panel 2302, battery pack identification panel 2304, warranty status panel 2306, and in-service panel 2308. In an embodiment, battery pack identification panel 2304 may display battery identification information, such as battery identification information described above with respect to FIGS. 15 and 16. Warranty status panel 2306 may display a cumulative warranty value for the battery pack, as well as other values related to warranty conditions for determining whether a battery warranty is valid. Finally, in-service panel 2308 displays information as to whether the battery is currently operating, and whether reporting status for the battery pack has been received at expected intervals.

Figure 24:
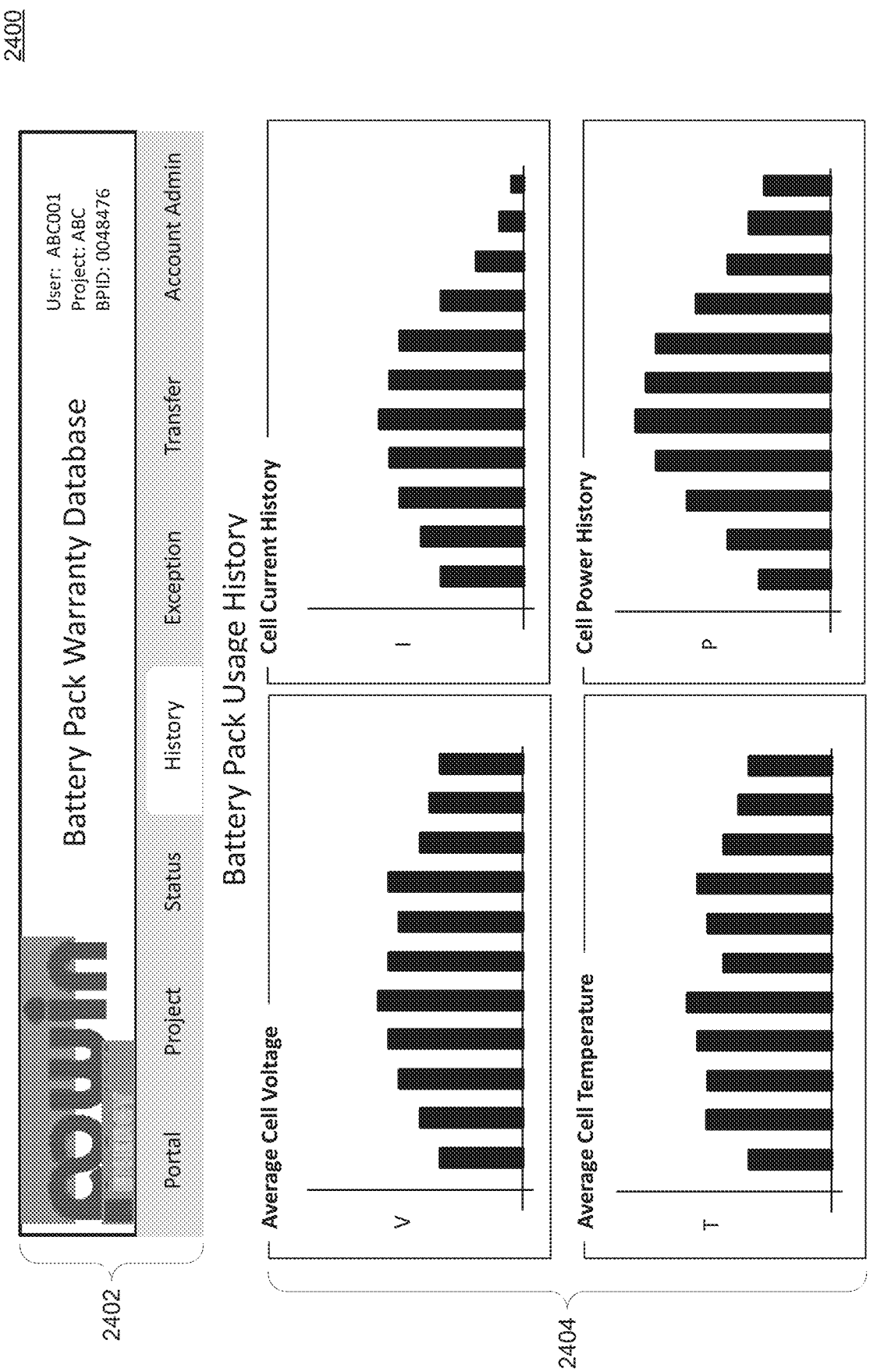
FIG. 24 is an example user interface for viewing historical battery usage data, according to an embodiment.

FIG. 24 is an example user interface 2400 for viewing historical battery usage data, according to an embodiment. User interface 2400 includes menu panel 2402 and battery pack usage history panel 2404. In an embodiment, battery pack usage history panel 2404 displays histograms of various battery sensor measurements and calculated values. For example, histograms are shown in FIG. 24 for average cell voltage, average cell temperature, cell current history, and cell power (voltage) history. In an embodiment, these histograms are constructed from counter values stored in a warranty database, such as described with respect to warranty database 1634 of FIG. 16.

FIG. 25 is an example user interface 2500 for viewing battery pack exceptions, according to an embodiment. User interface 2500 includes menu panel 2502 and exception panel 2504. In an embodiment, exception panel displays detected exceptions for a battery pack. Exceptions may be determined by comparing battery usage data to exception conditions, such as those described with respect to FIG. 16. For example, as illustrated in FIG. 25 for serial number 4977540568, both a late received report of usage data and a cell voltage higher than a predefined threshold may create an exception to the battery pack warranty.

Figure 26:
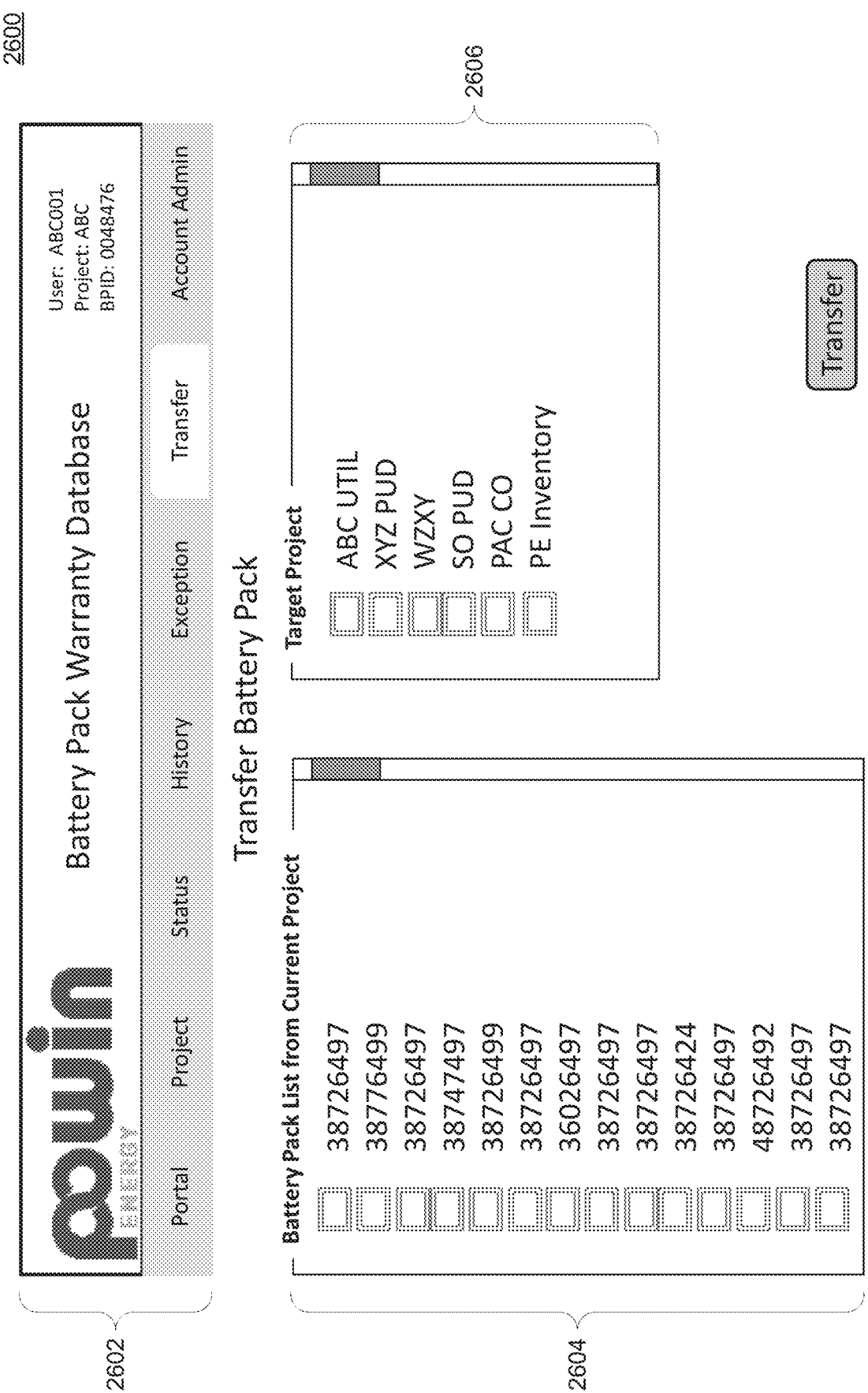
FIG. 26 is an example user interface for transferring a battery pack between projects, according to an embodiment.

FIG. 26 is an example user interface 2600 for transferring a battery pack between projects, according to an embodiment. User interface 2600 includes menu panel 2602, battery pack panel 2604, and target project panel 2606. In an embodiment, a user with permission to transfer a battery pack from one project to another may select a battery pack from battery pack panel 2604 to transfer to a selected project in target project panel 2606. This may occur, for example, if a battery pack is sold or physically moved to a new location.

FIG. 27 is an example administrative user interface 2700 for assigning task permissions, according to an embodiment. User interface 2700 includes menu panel 2702 and account administration panel 2704. In an embodiment, account administration panel 2704 may enable an administrator to assign task permissions to users, for example, transfer and account administration task permissions.

Figure 28:
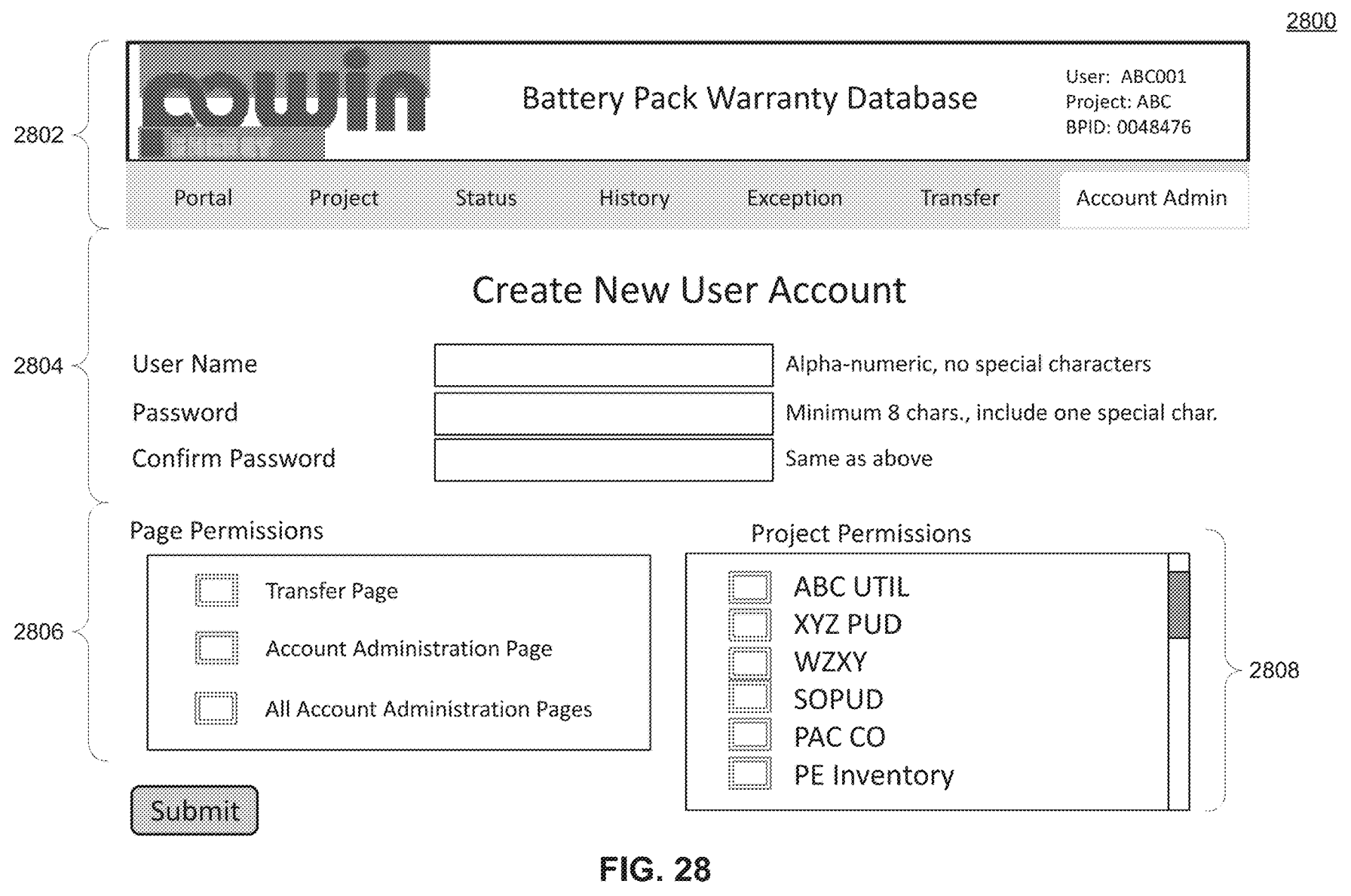

FIG. 28 is an example administrative user interface 2800 for creating a new user account, according to an embodiment. User interface 2800 includes menu panel 2802, new user panel 2804, page permissions panel 2806, and project permissions panel 2808. In an embodiment, new user panel 2804 enables an administrator to create a new user account, and specific page permissions and authorization to access particular projects may be specified in panels 2806 and 2808.

FIG. 29 is an example user interface 2900 for editing a user account, according to an embodiment. User interface 2900 includes menu panel 2902, edit user panel 2904, page permissions panel 2906, and project permissions panel 2908. Interface 2900 enables an administrator to perform the same functions for an existing user as described with respect to interface 2800 of FIG. 28 for a new user.

Figure 30:
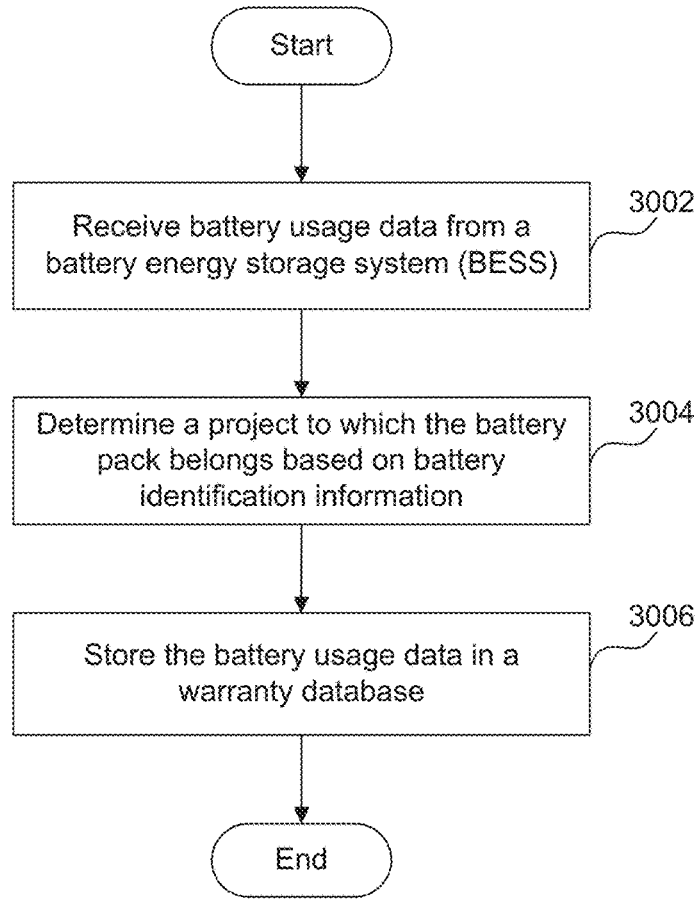
FIG. 30 is an example method for receiving and storing battery usage data, according to an embodiment.

FIG. 30 is an example method 3000 for receiving and storing battery usage data, according to an embodiment. Each stage of the example method may represent a computer-readable instruction stored on a non-transitory computer-readable storage device, which when executed by a processor causes the processor to perform one or more operations. Method 3000 begins at stage 3002 when battery usage data is received from a battery energy storage system (BESS), such as BESS 1502 of FIG. 15. In an embodiment, this battery usage data may include battery cell voltage, temperature, and/or electric current measurements, as discussed with respect to FIGS. 6-9. The battery usage data may further include computed warranty values or other calculated usage values or usage statistics, as discussed with respect to FIGS. 6-9, and battery identification information, such as but not limited to, a battery serial number, a date and/or time of data collection, manufacturer and model information, and project, location, or other BESS identification information.

At stage 3004, a project to which the battery pack belongs may be determined based on the received battery identification information. In an embodiment, a project refers to a physical location where battery packs are deployed and maintained, for example, a BESS such as BESS 1502 of FIG. 15. A project may also refer to a group of related battery energy storage systems, or any other logical grouping of deployed battery packs.

At stage 3006, the battery usage data may be stored in a warranty database, such as warranty database 1634 of FIG. 16. In an embodiment, the warranty database may be partitioned by project to simplify access permissions to data stored within the database, and the battery usage data may be stored in a database partition for the determined project.

Embodiments disclosed herein have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed. Also, Identifiers, such as "(a)," "(b)," "(i)," "(ii)," etc., are sometimes used for different elements or steps. These identifiers are used for clarity and do not necessarily designate an order for the elements or steps.

The foregoing description of specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present disclosure should not be limited by any of the above-described embodiments, but should be defined only in accordance with the following claims and their equivalents.

What is claimed is:

1. A system, comprising:
a battery energy storage system comprising:
a plurality of battery packs, each battery pack including:
a battery voltage measurement circuit configured to measure a voltage of the battery pack; and
a battery temperature measurement circuit configured to measure a temperature of the battery pack;
a string controller coupled to the plurality of battery packs and configured to:
measure an electric current associated with each battery pack of the plurality of battery packs; and
control charging and discharging of the plurality of battery packs; and
an array controller coupled to the string controller and configured to instruct the string controller to charge and discharge the plurality of battery packs based on a plurality of battery sensor measurements over a period of time for each of the plurality of battery packs, wherein the plurality of battery sensor measurements are measured by at least one of the battery voltage measurement circuit, the battery temperature measurement circuit, and the string controller;
a warranty database, implemented on one or more computing devices, configured to store battery usage data for the plurality of battery packs, wherein each battery pack is part of a project, and wherein the warranty database is partitioned by project; and
a data controller, implemented on the one or more computing devices, configured to, for each of the plurality of battery packs:
receive battery usage data from the battery energy storage system comprising the plurality of battery packs, the battery usage data including battery identification information, the plurality of battery sensor measurements for the battery pack, and a cumulative warranty value for the battery pack;
determine a project to which the battery pack belongs based on the received battery identification information; and
store the battery usage data in the warranty database in a partition of the warranty database for the determined project.

2. The system of claim 1, wherein the data controller is further configured to:
compare the received warranty value to a warranty threshold;
determine that a warranty exception has occurred when the received warranty value exceeds the warranty threshold; and
store the exception in the warranty database.

3. The system of claim 1, wherein the data controller is further configured to:
compare the plurality of battery sensor measurements for the battery pack to a maximum and a minimum sensor threshold;
determine that a warranty exception has occurred when one of the battery sensor measurements is above the maximum sensor threshold or below the minimum sensor threshold; and
store the exception in the warranty database.

4. The system of claim 1, further comprising:
a web server configured to:
receive a request from a user for battery usage data stored in the warranty database;
verify that the requested battery usage data is authorized to be accessed by the user; and
provide the stored battery usage data to a graphical user interface upon verifying that the requested battery usage data is authorized to be accessed.

5. The system of claim 1, wherein the plurality of battery sensor measurements include one or more electric current measurements, one or more temperature measurements and one or more voltage measurements.

6. The system of claim 1, wherein the array controller is further configured to transmit the battery usage data to the data controller.

7. The system of claim 1, further comprising:
a battery usage collection device comprising:
a memory configured to store battery usage data for the plurality of battery packs; and
a warranty daemon configured to, for each battery pack:
receive battery usage data for the battery pack, wherein the battery usage collection device is connected to the battery energy storage system, and wherein the battery usage data includes battery identification information and the plurality of battery sensor measurements for the battery pack;
compute the warranty value for the battery pack based on the received battery sensor measurements;
store the battery usage data and the computed warranty value in the memory; and
transmit the stored battery usage data and the computed warranty value to the data controller via a data network.

8. The system of claim 1, wherein the data controller is further configured to, for each of the plurality of battery packs:
periodically generate a report including battery usage data stored in the warranty database for the battery pack and an exception status for the battery pack; and
transmit the report to a party servicing a warranty for the battery pack.

9. A method, comprising:
receiving a plurality of battery sensor measurements over a period of time for each of a plurality of battery packs stored in a battery energy storage system, wherein the plurality of battery sensor measurements are measured by at least one of a battery voltage measurement circuit, a battery temperature measurement circuit, and an electric current measurement circuit;
controlling, by a string controller of the battery energy storage system, charging and discharging of the plurality of battery packs;
instructing, by an array controller of the battery energy storage system, the string controller to charge and discharge the plurality of battery packs based on the plurality of battery sensor measurements;
receiving, for each of the plurality of battery packs, battery usage data from the battery energy storage system, the battery usage data including battery identification information, the plurality of battery sensor measurements for the battery pack, and a cumulative warranty value for the battery pack;

determining, for each of the plurality of battery packs, a project to which the battery pack belongs based on the received battery identification information; and storing the battery usage data in a warranty database, wherein the warranty database is partitioned by project, and wherein the battery usage data is stored in a partition of the warranty database for the determined project.

10. The method of claim 9, further comprising:

comparing the received warranty value to a warranty threshold;

determining that a warranty exception has occurred when the received warranty value exceeds the warranty threshold; and storing the exception in the warranty database.

11. The method of claim 9, further comprising:

comparing the plurality of battery sensor measurements for the battery pack to a maximum and a minimum sensor threshold;

determining that a warranty exception has occurred when one of the battery sensor measurements is above the maximum sensor threshold or below the minimum sensor threshold; and storing the exception in the warranty database.

12. The method of claim 9, further comprising:

receiving a request from a user for battery usage data stored in the warranty database;

verifying that the requested battery usage data is authorized to be accessed by the user; and providing the stored battery usage data to a graphical user interface upon verifying that the requested battery usage data is authorized to be accessed.

13. The method of claim 9, wherein the plurality of battery sensor measurements include one or more electric current measurements, one or more temperature measurements and one or more voltage measurements.

14. The method of claim 9, further comprising, for each of the plurality of battery packs: periodically generating a report including battery usage data stored in the warranty database for the battery pack and an exception status far the battery pack; and transmitting the report to a party servicing a warranty for the battery pack.

15. A system, comprising:

a battery energy storage system comprising:

a plurality of battery packs, each battery pack including:

a battery voltage measurement circuit configured to measure a voltage of the battery pack; and a battery temperature measurement circuit configured to measure a temperature of the battery pack;

a string controller coupled to the plurality of battery packs and configured to:

measure an electric current associated with each battery pack of the plurality of battery packs; and control charging and discharging of the plurality of battery packs; and an array controller coupled to the string controller and configured to instruct the string controller to charge and discharge the plurality of battery packs based on a plurality of battery sensor measurements over a period of time for each of the plurality of battery packs, wherein the plurality of battery sensor measurements are measured by at least one of the battery voltage measurement circuit, the battery temperature measurement circuit, and the string controller;

a battery usage collection device, comprising:

a memory configured to store battery usage data for the plurality of battery packs; and a warranty daemon configured to, for each of the plurality of battery packs contained within the battery energy storage system:

receive battery usage data for the battery pack, wherein the battery usage collection device is connected to the battery energy storage system, and wherein the battery usage data includes battery identification information and the plurality of battery sensor measurements for the battery pack;

compute a warranty value for the battery pack based on the received plurality of battery sensor measurements for the battery pack;

store the battery usage data and the computed warranty value in the memory; and transmit the stored battery usage data and the computed warranty value to a data center via a data network for analysis.

16. The battery usage collection device of claim 15, wherein the plurality of battery sensor measurements include one or more electric current measurements, one or more temperature measurements and one or more voltage measurements.

17. The battery usage collection device of claim 15, wherein the warranty daemon is further configured to store the battery usage data by:

correlating each of the plurality of battery sensor measurement to a predefined range of measurement values; and incrementing a fixed-size counter stored in the memory that corresponds to the predefined range of measurement values.

18. The battery usage collection device of claim 15, wherein the warranty daemon is further configured to normalize the received battery usage data according to a predefined data format.

19. The battery usage collection device of claim 15, wherein the warranty daemon is further configured to receive the battery usage data by:

opening a data file containing the battery usage data; and parsing the data file according to predefined rules to extract the plurality of battery sensor measurements.

20. The battery usage collection device of claim 15, wherein the warranty daemon is further configured to receive the battery usage data via an application programming interface (API) provided by the battery energy storage system.

* * * * *